United States Patent
Kim et al.

(10) Patent No.: US 9,989,797 B2
(45) Date of Patent: *Jun. 5, 2018

(54) TOUCH RECOGNITION ENABLED DISPLAY PANEL WITH ASYMMETRIC BLACK MATRIX PATTERN

(71) Applicant: LG Display Co., Ltd., Seoul (KR)

(72) Inventors: Seongsu Kim, Jeollabuk-do (KR); Taesang Kim, Cheonan-si (KR); Mingyeong Kim, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 291 days.

This patent is subject to a terminal disclaimer.

(21) Appl. No.: 14/841,545

(22) Filed: Aug. 31, 2015

(65) Prior Publication Data

US 2017/0059912 A1 Mar. 2, 2017

(51) Int. Cl.
*G02F 1/1333* (2006.01)
*G06F 3/041* (2006.01)
*H01L 27/12* (2006.01)
*G02F 1/1362* (2006.01)

(52) U.S. Cl.
CPC .... *G02F 1/13338* (2013.01); *G02F 1/136286* (2013.01); *G06F 3/0412* (2013.01); *H01L 27/124* (2013.01); *G02F 2001/13629* (2013.01); *G02F 2001/133357* (2013.01); *G02F 2201/40* (2013.01)

(58) Field of Classification Search
None
See application file for complete search history.

(56) References Cited

U.S. PATENT DOCUMENTS

| 2011/0090446 A1* | 4/2011 | Kim | G02F 1/136213 349/139 |
| 2016/0291789 A1* | 10/2016 | Zhai | G06F 3/0412 |
| 2017/0045984 A1* | 2/2017 | Lu | G06F 3/041 |

\* cited by examiner

*Primary Examiner* — Dennis Y Kim
(74) *Attorney, Agent, or Firm* — Fenwick & West LLP

(57) ABSTRACT

A touch recognition enabled display panel includes a plurality of common electrode blocks serving as touch-sensing regions and/or touch-driving regions. Conductive lines connected to the common electrode blocks are placed under the common electrode blocks and the pixel electrodes of the pixels, and they are routed across the active area, directly toward an inactive area where drive-integrated circuits are located. The conductive lines are positioned under one or more planarization layers, and are connected to the corresponding common electrode blocks via one or more contact holes.

10 Claims, 17 Drawing Sheets

TOUCH RECOGNITION ENABLED DISPLAY PANEL WITH ASYMMETRIC BLACK MATRIX PATTERN

BACKGROUND OF THE INVENTION

Field of the Invention

The present disclosure generally relates to a display panel, and more particularly to a display panel configured for advanced capacitance touch-sensing and a method for manufacturing the same.

Description of the Related Art

A touch screen allows a user to interact with a device simply by touching the graphical interface displayed on the screen with fingers, stylus or other objects. With ease of use and versatility in operation, the touch screen has been one of the most popular user interaction mechanism used in a variety of flat panel displays such as liquid crystal displays (LCDs) and organic light emitting diode (OLED) displays electronic devices.

Conventionally, a substrate with a matrix of touch-driving lines and touch-sensing lines is overlaid on a display panel to provide the touch-sensing functionality. However, placing a separate substrate for sensing touch inputs on the display panel adds to the thickness and the weight of the display panel. As such, attempts have been made to integrate components of the touch sensor within the stacks of layers forming the display panel. Integrating the touch sensor components within the display panel, however, often necessitates some compromises to be made in the display qualities. For instance, conductive lines transmitting signals to and from the display regions in the display panel for an implementation of touch-sensing mechanism may generate unwanted parasitic capacitance with other components of the display panel, which may result in visual defects (e.g., irregular tilting angle of liquid crystal molecules, line dim, moiré effects, etc.).

SUMMARY

The present disclosure generally relates to display panels provided with touch-sensing functionality, and more particularly, to configuration of touch sensors within a display panel with minimal visual defects from the touch sensors integrated therein.

In a display panel, some elements used in relation with a display functionality can be configured to recognize touch inputs on the screen. For instance, integrated circuits (ICs) may be configured to provide signals for operating the display pixels and for sensing the touch inputs. Also, some electrodes and/or conductive layers implementing a storage capacitor in display pixels used for displaying image from the display panel can be configured to serve as a part of a touch sensor. In this way, a display panel with a lighter weight and thinner profile can be manufactured using fewer parts in fewer manufacturing steps. Such configurations can also eliminate or otherwise reduce various undesired side effects, which may result from placing discrete touch sensor components in the display panel.

When implementing a touch sensor within a display panel, fine-tuning of both the touch-sensing functionality and the display functionality can be a challenging task. Among various types of LCD display panels, arrangement of the components for both functionalities can be especially challenging for the in-plane-switching (IPS) type and the fringe-field-switching (FFS) type LCD display panels as the electrodes for generating fields that controls the orientation of the liquid crystal molecules are provided on the same side of the liquid crystal layer.

Accordingly, a display panel is provided with a plurality of common signal lines SL on a substrate. The common signal lines are covered by a lower planarization layer. The lower planarization layer is provided over the common signal lines in a thickness sufficient to provide a planar surface over the plurality of common signal lines. A plurality of gate lines, a plurality of data lines and a plurality of thin-film-transistors (TFT) are provided on the planar surface provided by the lower planarization layer, forming an array of TFTs. That is, the gate lines and the data lines define a matrix of pixel regions, in which each pixel region is provided with a TFT of the array. Because the lower planarization layer is provided underneath the array of the TFT, the lower planarization layer should be formed of a material with a sufficient thermal stability capable to withstand processes involved in forming the components thereabove, such as an array of thin-film-transistors, and to maintain the planar surface over the common signal lines. As such, the lower planarization layer may be an inorganic material, for example a silicon-based material.

An upper planarization layer is provided over the gate lines, the data lines and the array of TFTs. A plurality of transparent electrode blocks and a plurality of pixel electrodes are provided on the upper planarization layer. While the pixel electrodes are provided on a pixel basis, the transparent electrode blocks are shared by a group of pixels.

The common signal lines may be provided in a first metal layer, the bypass lines may be provided in a second metal layer along with the gate lines, and the data lines may be provided in a third metal layer along with the source/drain electrodes of the TFTs. In other words, the bypass lines are provided in between the lower planarization layer and the upper planarization layer. Accordingly, each bypass line of the set is connected to the common signal line via a lower contact hole through the lower planarization layer and connected to the transparent electrode block via an upper contact hole through the upper planarization layer.

In some embodiments, multiple bypass lines are used to connect a single common signal line to a transparent electrode block provided over a group of pixel regions. In some embodiments, multiple common signal lines can be used to connect each individual transparent electrode block. Further, in some embodiments, the display panel may be provided with a plurality of dummy lines, and one or more dummy lines may be connected to the transparent electrode block. Accordingly, each of the transparent electrode blocks is connected to a set of bypass lines.

In some embodiments, the common signal lines may be arranged in the same orientation as the data lines (e.g., Y-axis). In such embodiments, each one of the common signal lines may be arranged underneath one of the corresponding data lines. The bypass lines may be arranged in the same orientation as the gate lines (e.g., X-Axis).

In some embodiments, the lower contact hole for a first bypass line of the set and the lower contact hole for a second bypass line of the set are provided in pixels of a different row and a column. More specifically, the set of bypass lines includes a bypass line contacting the common signal line via a lower contact hole through the lower planarization layer at a first pixel region and another bypass line contacting the same common signal line via a lower contact hole through the first planarization layer at a second pixel region. Here, the first pixel region and the second pixel region are positioned in a different row and a column in the matrix of pixel regions.

In some embodiments, an upper contact hole for a first bypass of the set and an upper contact hole for a second bypass line of the set can be provided in pixels of a different row and a column. More specifically, the set of bypass lines includes a bypass line connected to said one of the plurality of transparent electrode blocks via an upper contact hole through the second planarization layer at a first pixel region and another bypass line contacting the same transparent electrode block via an upper contact hole through the second planarization layer at a second pixel region. Here, the first pixel region and the second pixel region are positioned in a different row and a column in the matrix of pixel regions.

A group of pixel regions arranged under each transparent electrode includes a plurality of normal pixel regions and a plurality of bypass pixel regions. Each bypass line extends across at least two consecutively arrange pixel regions from a first bypass pixel that accommodates the lower contact hole to a second bypass pixel that accommodates the upper contact hole. As such, the aperture ratio of the bypass pixels are reduced by the lower contact hole, the upper contact hole as well as the bypass line extending between lower contact hole and the upper contact hole. The normal pixels are the pixels of which their aperture ratio is not reduced by the bypass line. In other words, the normal pixels are the pixels without any part of the bypass lines extending therein.

In some embodiments, the aperture ratio of the first bypass pixel region and the second bypass pixel region accommodating the lower contact hole and the upper contact hole, respectively, may be smaller than the aperture ratio of the interim bypass pixel regions positioned between the first bypass pixel region and the second bypass pixel region. Further, the aperture ratio of the first bypass pixel region with the lower contact hole placed therein may be smaller than the aperture ratio of the second bypass pixel region with the upper contact hole placed therein.

In some embodiments, the first bypass pixel region and the second bypass pixel region are two adjacent pixel regions of the same pixel group, which are configured to transmit light of blue color. In some embodiments, the first bypass pixel region and the second bypass pixel region are two adjacent blue color light emitting pixel regions of the same pixel group, and at least one intermediate bypass pixel region is provided between the first bypass pixel region and the second bypass pixel region. In some embodiments, the first bypass pixel region and the second bypass pixel region are two blue color light emitting pixel regions of the same row in the same group of pixel regions, and one or more intermediate bypass pixel regions are provided between the first bypass pixel region and the second bypass pixel region. When a plurality of intermediate bypass pixel regions are provided between the first bypass pixel region and the second bypass pixel region, the intermediate bypass pixel regions may include a blue color light emitting pixel region.

Each of the common signal line includes a routing portion and at least one contact portion. The routing portion extends parallel to the data lines, and the contact portion projects out from the routing portion toward a lower contact hole to be in contact with a respective bypass line.

In some embodiments, at least one of the common signal line is provided with a plurality of contact portions, each being extended to a lower contact hole where a respective ones of bypass lines contact the common signal line. The bypass lines in contact with the plurality of contact portions of the common signal line are connected to the same transparent electrode block. In some embodiments, the plurality of contact portions may include at least two contact portions, each having a different length from one another. Also, the plurality of contact portions may include a contact portion extended to a pixel region positioned in a row and a column, which is different from a row and a column of another contact portion of the same common signal line. The plurality of contact portion of the common signal line may include a contact portion, which is arranged to extend across one or more gate lines. The plurality of contact portions may include a contact portion extending toward a first side of the routing portion and another contact portion extending toward a second side of the routing portion of the common signal line.

In some embodiments, the display panel may further include a plurality of dummy lines. The dummy lines are formed of the same metal layer as the common signal line, and are covered under the lower planarization layer. The dummy lines are arranged in the same orientation as the common signal lines. That is, the dummy lines may be laid along the data lines. In this case, each dummy line may be arranged to at least partially overlap with one of the data lines.

In some embodiments, the dummy lines are provided as floating line. Also, in some embodiments, the dummy lines are provided as ground line. Further, in some embodiments, the dummy lines are provided with a DC voltage.

In some embodiments, one or more of the dummy lines are connected to one of the transparent electrode block. Here, the connection between the dummy line and the transparent electrode block is made via one or more bypass lines. The bypass line(s) can be connected to the dummy line via a lower contact hole formed through the lower planarization layer, and can be connected to the transparent electrode block via an upper contact hole formed through the upper planarization layer. Although the dummy lines are not directly connected to the drive IC across the active area of the display panel, the dummy line lines can transfer signals between two points within a transparent electrode. Similar to the common signal lines, each dummy line may include a routing portion and a plurality of contact portions, each extended to a pixel region where a lower contact hole is provided. The length and the orientation of the contact portions as well as the arrangement of the pixel regions where the contact portions are extended to may be configured in the similar way as the contact portions of the common signal line.

In the embodiments provided with the plurality of dummy liens, the plurality of contact portions of at least one of the common signal lines may include a contact portion arranged to extend across one or more of dummy lines. Further, the plurality of contact portions of at least one of the common signal lines may include at least two contact portions, each being arranged to extend across a different number of dummy lines.

The display panel further includes a masking layer, which includes a plurality of data BM sections and a plurality of gate BM sections. In some embodiments, some part of the data BM strip can be asymmetrically arranged from other parts of the same data BM strip, in order to reduce the aperture ratio discrepancy among the pixel regions.

The common signal line SL may be configured to transmit touch control signals to and from a touch drive integrated circuit and the transparent electrode connected thereto.

In some embodiments, the transparent electrode blocks may be configured to implement a self-capacitance touch recognition system in the display panel. In this configuration, one or more common signal lines connected to one of the transparent electrode blocks are routed under and across other transparent electrode blocks, such that each of the transparent electrode block is individually controlled by a touch drive integrated circuit.

In some other embodiments, the transparent electrode blocks can be configured to implement a mutual-capacitance touch recognition system in the display panel. In this configuration, one or more common signal lines connected to one of the transparent electrode blocks is routed under and across other transparent electrode blocks, and the common signal lines can be selectively grouped at the non-display area of the display panel to control the transparent electrode blocks in selective groups, in which some of the selective groups serves as touch driving region and some of the selective groups serves as touch sensing region of the mutual-capacitance touch recognition system.

In an aspect, the present invention is directed to a touch recognition enabled liquid crystal display (LCD) panel. In an embodiment, the touch recognition enable LCD panel includes a plurality of pixels operated by a pixel electrode and a common electrode. The common electrode of the LCD panel is provided in a plurality of common electrode blocks, and each common electrode block is shared by a group of pixels. Further included in the touch recognition enabled LCD panel is a plurality of common signal lines. Each common signal line is configured to transmit touch control recognition signals between a touch drive integrated circuit and one or more of the common electrode blocks. A lower planarization layer is provided over the plurality of common signal lines, and a plurality of thin-film-transistors are provided on the lower planarization layer. An upper planarization layer is provided over the plurality of thin-film-transistors, and the pixel electrodes and the plurality of common electrode blocks are provided on the upper planarization layer. Each common electrode block is connected to at least one of the common signal lines via a set of bypass lines. The set of bypass lines for one of the common electrode blocks includes at least one bypass line that is arranged differently from at least one bypass line of another set of bypass lines connected to another one of the common electrode blocks.

DETAILED DESCRIPTION

Reference will now be made in detail to the exemplary embodiments of the present invention, examples of which are illustrated in the accompanying drawings. Wherever possible, the same reference numbers will be used throughout the drawings to refer to the same or like parts.

Example embodiments may be described herein with reference to a Cartesian coordinate system in which the x-direction and the y-direction can be equated to the horizontal (row) direction and the vertical (column) direction, respectively. However, one skilled in the art will understand that reference to a particular coordinate system is simply for the purpose of clarity, and does not limit the direction of the structures to a particular direction or a particular coordinate system.

The following description includes embodiments described in the context of LCDs, in particular the In-Plane-Switching (IPS) mode LCD and the Fringe-Field-Switching (FFS) mode LCD, in which the common electrodes and the pixel electrodes of the pixels are arranged on one of the substrates that enclose the liquid crystal layer. However, it should be appreciated that the features described here can be applied to various other kinds of displays so long as the display is equipped with a plurality of conductive lines placed under the array of TFTs and the plurality of conductive lines are connected to electrodes placed above the array of TFTs by using bypass lines.

For instance, in an organic-light-emitting-diode (OLED) display, a plurality of conductive lines may be placed on one side of the TFT array, and the conductive lines may be connected to electrodes provided on the other side of the TFT array. The electrodes provided on the other side of the TFT array may be shared among a group of pixels to provide touch recognition functionality. Further, the functionality of the electrodes provided on the other side of the TFT array is not limited to the touch sensing, but may also be used for various other functionalities such as touch-pressure sensing functionality, tactile feedback functionality and more.

Figure 1:
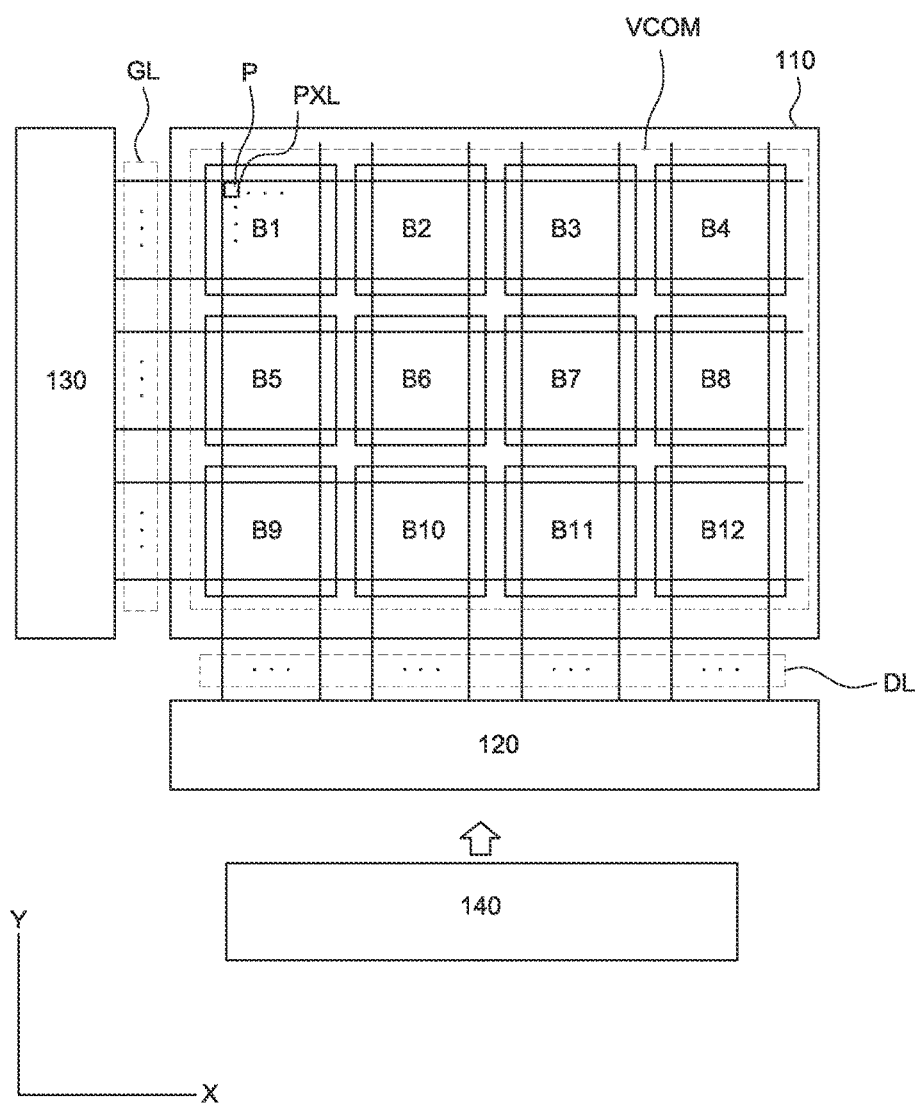
FIG. 1 illustrates an exemplary display panel according to an embodiment of the present disclosure.

FIG. 1 schematically illustrates a configuration of a display panel 100 according to an embodiment of the present invention. Referring to FIG. 1, the display panel 100 includes a substrate 110 provided with a plurality of display pixels P, connected to a plurality of data lines DL and a plurality of gate lines GL. A data drive integrated circuit (IC) 120 and a gate drive integrated circuit 130 are provided in the area outside the active area, which may be referred to as the inactive area (i.e., non-display area). The data-drive IC 120 and the gate-drive IC 130 are configured to provide data signals and the gate signals on the data lines DL and the gate lines GL, respectively, to operate display pixels P in the active area.

Each of the display pixels includes a thin-film-transistor (TFT) with a gate, a source and a drain. Each of the display pixel P includes a capacitor, which is formed with a pixel electrode and a common electrode VCOM. The gate of the TFT is connected to a gate line GL, the source of the TFT is connected to the data line DL and the drain of the TFT is connected to the pixel electrode PXL of the respective pixel.

The pixels include electrodes or other capacitive elements may be used for a display functionality and also for touch-sensing functionality. In a liquid crystal display, for instance, the pixel electrode and the common electrode are provided with data voltage and the common voltage, respectively, to generate electrical fields across the liquid crystal molecules to control the amount of light passing through the layer of the liquid crystal molecules. In the display panel depicted in FIG. 1, the common electrode VCOM is divided into a plurality of common electrode blocks (B1-B12).

The touch drive integrated circuit 140 is configured to send and receive touch-sensing related signals to and from each of the common electrode blocks via a plurality of common signal lines SL to use the common electrode blocks in sensing touch inputs on the display panel 100. It should be appreciated that other transparent electrodes provided in the display panel may be divided into a plurality of blocks, and configured to send and receive touch-sensing related signals to and from the touch drive-IC 140 via a plurality of common signal lines SL. Similarly, a plurality of transparent electrode blocks arranged across the active area in an organic-light-emitting diode (OLED) display panel can also be configured to communicate with the touch drive-IC 140 via a plurality of common signal lines SL.

In some embodiments, some of the touch sense functionality related signals communicated between the touch-drive IC 140 and the plurality of common electrode blocks may be transmitted via the data-drive IC 120. In some embodiments, all of the data-drive IC 120, the gate-drive IC 130 and the touch-drive IC 140 may be provided on the substrate 110. In some other embodiments, some of those drive ICs may be provided on a separate printed circuit board, which is connected to the substrate 110 using a connection means (e.g., pads, pins, etc.). Although each of the data-drive IC 120, the gate-drive IC 130 and the touch-drive IC 140 is illustrated as a discrete component in the display panel 100, some or all of these drive ICs may be integrated with one another into a single component. For instance, the touch-drive IC 140 may be provided as a part of the data drive IC 120. Also, the data drive IC 120 and the touch-drive IC 140 may be provided on the same printed circuit board, which is connected to the common signal lines and the data lines provided on the substrate 110.

Figure 2A:
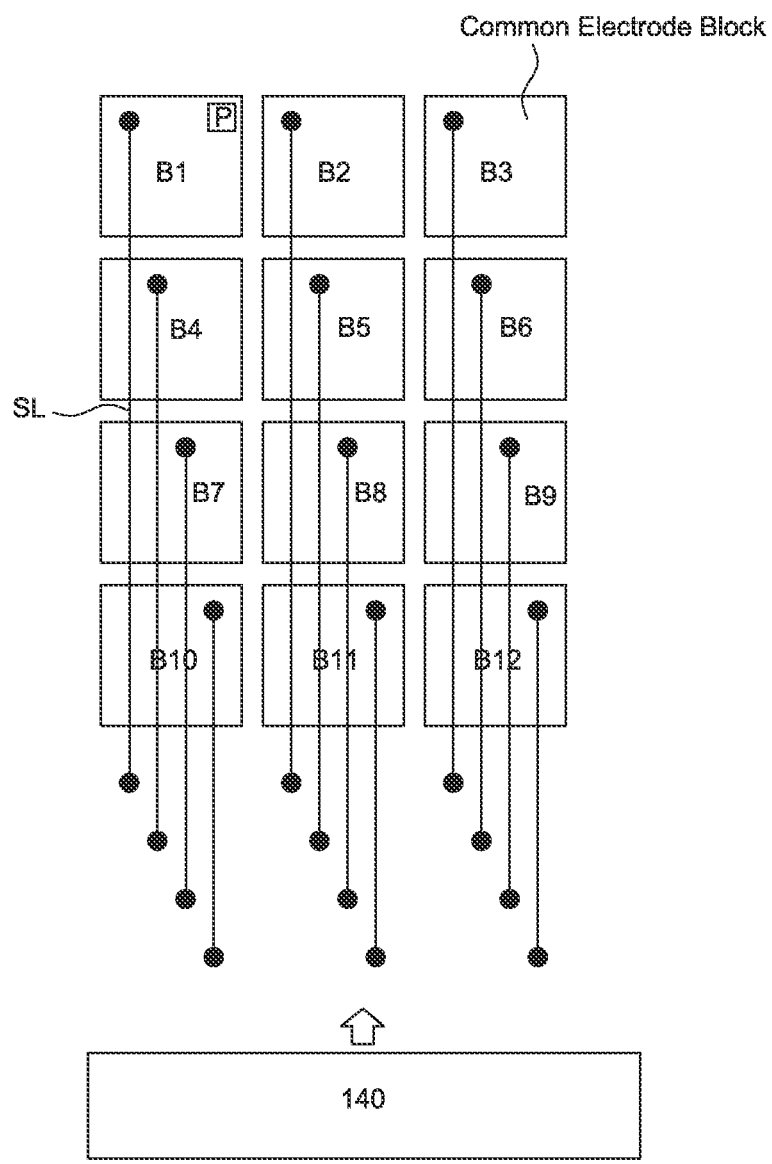
FIG. 2A is a schematic illustration of an exemplary display panel with a plurality of transparent electrode blocks, in which each of the transparent electrode blocks is connected to a common signal line and configured to operate in a self-capacitance touch sensor, according to an embodiment of the disclosure.
Figure 2B:
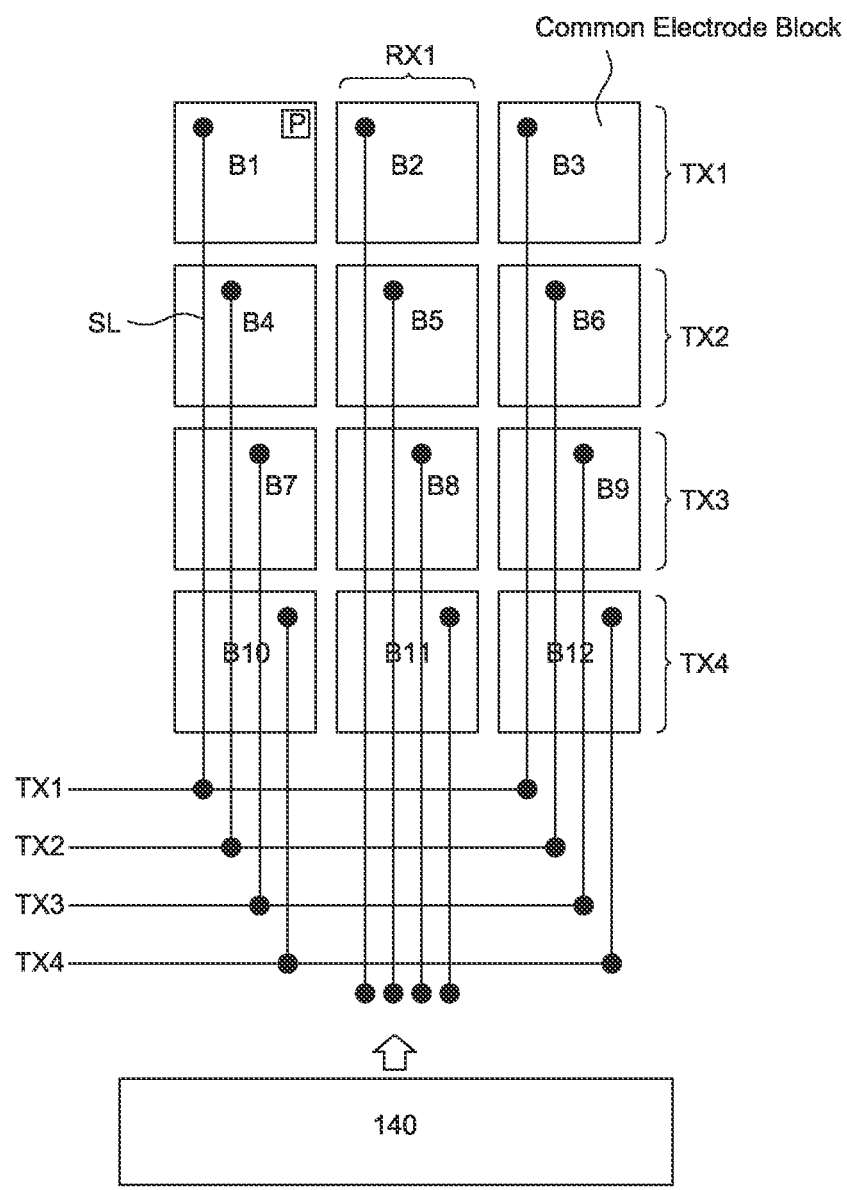
FIG. 2B is a schematic illustration of an exemplary display panel with a plurality of transparent electrode blocks, in which each of the transparent electrode blocks is connected to a common signal line and configured to operate in a mutual-capacitance touch sensor, according to an embodiment of the disclosure.

FIGS. 2A and 2B illustrate exemplary configurations of the transparent electrode blocks (e.g., common electrode blocks) and the wirings for the transparent electrode blocks to implement a touch sensor in the display panel 100. In particular, FIG. 2A illustrates an exemplary configuration of common electrode blocks and the common signal lines SL for a self-capacitance touch recognition system. In the self-capacitance touch recognition system, each common electrode blocks (B1-B12) function as a touch sense electrode with a unique coordinate, and thus change of capacitance read from each of the common electrode blocks can be used to detect the location of the touch inputs on the display panel 100. To achieve this, each common electrode block is configured to communicate with the touch-drive IC 140 separately from other common electrode blocks by using an independent common signal line SL.

FIG. 2B illustrates an exemplary configuration of common electrode blocks (B1-B12) and the common signal lines SL for a mutual-capacitance touch recognition system in the display panel 100. Unlike the self-capacitance touch recognition system, the mutual-capacitance touch recognition system relies on the changes in capacitance between a pair of touch-driving electrode and a touch-sensing electrode to detect the location of the touch inputs on the display panel 100. Accordingly, in a mutual-capacitance touch recognition system, the common electrode blocks are selectively grouped together so that some groups of common electrode blocks serve as touch-driving electrodes and some other groups of common electrode blocks serve as touch-sensing electrodes. To this end, the common signal lines SL can be grouped together such that each group of common electrode blocks arranged in one direction (e.g., X-direction) collectively forms a touch-driving line (e.g., TX1-TX4), and each group of common electrode blocks arranged in another direction (e.g., Y-direction) collectively forms a touch-sensing line (e.g., RX1).

The common signal lines SL connected to the corresponding ones of the common electrode blocks are routed directly across the active area, and they are grouped together at the outside of the active area to form either the TX lines or the RX lines. For example, the common signal lines SL from the common electrode blocks B1 and B3 are grouped together as illustrated in FIG. 2B, so that the first touch-driving line TX1 is formed in X-direction. Similarly, the common signal lines SL from the common electrode blocks B4 and B6, the common electrode blocks B7 and B9, and the common electrode blocks B10 and B12 are grouped together to form touch-driving lines TX2, TX3 and TX4, respectively. The touch-sensing line RX is formed in Y-direction by grouping the common signal lines SL from the common electrode blocks B2, B5, B8 and B11. The TX lines TX1-TX4 are oriented in in same direction as the gate lines GL (e.g., X-Direction), and the touch-sensing line RX oriented in the same direction as the data lines DL (Y-Direction). In this way, a mutual capacitance is formed at intersections between the TX lines and the Rx line.

For the sake of simplicity, FIGS. 2A and 2B were shown with only 12 common electrode blocks implementing the touch sensors in the display panel 100. However, it should be understood that the number of common electrode blocks provided in the display panel 100 is not limited as such, and the common electrode of the display panel 100 can be divided into additional number of common electrode blocks. By way of an example, a 9.7 inch display panel may include 36×48 common electrode blocks. Also, it should be noted that the size of individual pixels may be much smaller than the size of an individual unit of touch sense region to be provided in the display panel 100. In other words, the size of each common electrode block can be larger than the size of each individual pixel. Accordingly, a group of pixels shares a single common electrode block, although each of those pixels is provided with an individual pixel electrode. By way of an example, each common electrode block may be shared by 42×42 pixels.

Figure 3:
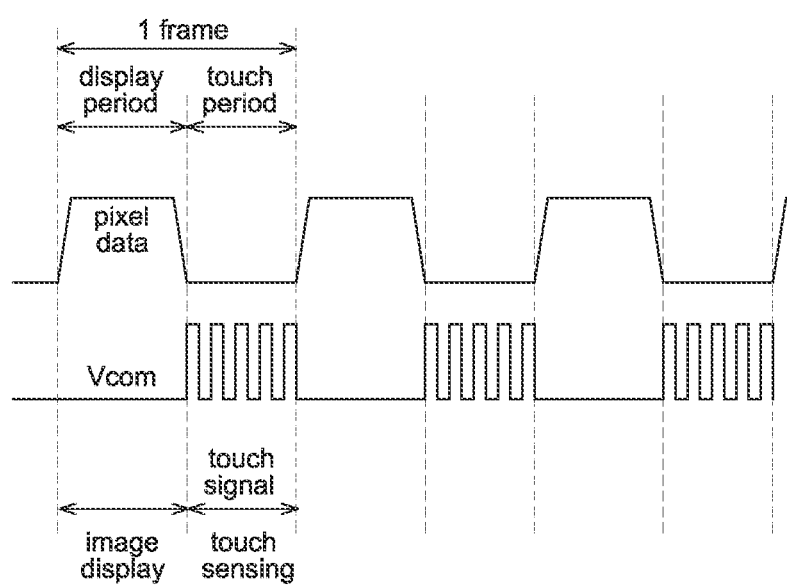
FIG. 3 is a timing diagram showing exemplary signals applied to a transparent electrode blocks and a pixel electrodes of a pixel during a display period and during a touch sense period according to an embodiment of the disclosure.

FIG. 3 shows exemplary signals applied through the common signal lines SL to the common electrode blocks during a display period and during a touch-sensing period. Since the common electrode blocks are also used as the touch electrode, they are transmitted with signals related to display functionality for a certain period and provided with touch sensing related signals for a certain period. That is, in one frame period, which is defined by the vertical sync signal, includes a display period and a touch-sensing period.

The display period may only be a part of one frame period. In the display period, the gate signals and the data signals are provided on the gate lines and the data lines, respectively, for charging the pixels with new image data. The remainder of the frame period can be used for preparing the pixels to receive the next image data as well as for scanning the common electrode blocks for identifying touch inputs on the screen. For instance, each frame is 16.6 ms when a display panel configured operated at a frequency of 60 frames per second. Within 16.6 ms, about 12 ms can be dedicated for the display period. The rest can be used for carrying out the touch-sensing functionality and for preparing the pixels to receive a new frame of image data.

Accordingly, the common voltage signal is transmitted from the data-drive IC 120 to the common electrode blocks during the display period. The common voltage signal may be in the form of a pulse signal that swings between a positive voltage and a negative voltage to perform LCD inversion. In some embodiments, the common voltage signal is supplied to the common electrode blocks via the common signal lines SL. In some other embodiments, the common voltage signal can be supplied to the common electrode blocks via dedicated common voltage signal line other than the common signal line SL. Further, in some embodiments, the common voltage signal can be supplied to the common electrode blocks via the common signal lines SL even though the display panel includes one or more other signal lines configured to provide the common voltage signal to the common electrode blocks.

In the touch period, the touch-driving signal is transmitted from the touch-drive IC 140 to the common electrode blocks via the common signal lines SL. In cases where the common electrode blocks are configured as the self-capacitance touch recognition system, each of the common electrode blocks are provided with touch-driving pulses, and the signals from each of the common electrode blocks are analyzed to determine whether a touch input was registered on a particular common electrode block. More specifically, in the self-capacitive touch recognition system, charging or discharging of the touch-driving pulse on the common electrode blocks can be used to determine touch inputs on the common electrode blocks. For example, a change in the capacitance value upon a touch input changes the time in which the voltage slope on the common electrode block. Such a change on each of the common electrode blocks can be analyzed to determine the location of touch input on the display panel 100.

In cases where the common electrode blocks are configured as the mutual-capacitance touch recognition system, groups of common electrode blocks that are configured as the touch-driving lines (TX) are provided with the touch-driving pulses, and groups of common electrode blocks that are configured as the touch-sensing lines (RX) are provided with a touch reference voltage signal. A touch input made on the display panel 100 changes the capacitive coupling at the intersection of the touch driving line (TX) and the touch sensing line (RX), and it changes the current that is carried by the touch sensing line (RX). This information in a raw or in some processed form can be used to determine the locations of touch inputs on the display panel 100. The touch drive IC 140 performs this operation for each intersection of the TX and RX lines at rapid rate so as to provide multipoint sensing.

In the example shown in FIG. 2B, each of the TX lines was defined by a group of common electrode blocks arranged in a row (X-direction), and each of the RX lines was defined by a group of common electrode blocks arranged in a column (Y-direction). However, the arrangement of the common electrode blocks is not limited as such, and may be arranged in a various other ways depending on the desired layout of the TX and RX lines in the display panel 100. The number of TX lines implemented with the common electrode blocks arranged in a single row as well as the number of RX lines implemented with the common electrode blocks arranged in a single column can vary depending on various factors. For instance, the common electrode blocks arranged in a single row can be used to provide multiple TX lines, and the common electrode blocks arranged in a single column can be used to provide multiple RX lines based on the touch scanning frequency and the accuracy as well as the size of the display panel 100.

Also, the RX line in the mutual-capacitance touch recognition system can be formed with a common electrode block that is larger than the common electrode blocks forming the TX lines. For instance, rather than forming an RX line with a plurality of common electrode blocks arranged in column direction, a single large common electrode block that extends across the active area in the column direction (i.e., Y-direction) can be used as a RX line.

In order to improve the touch-sensing accuracy at the edges of the display panel 100, the common signal lines SL from the common electrode blocks positioned at each of the far most ends of the active area (i.e., left and right ends) can be grouped together such that RX lines are formed at the far most ends of the active area. In this way, touch inputs made by the object with a very smaller touch point (e.g., 2.5Φ) than a typical size of a finger can be recognized at the edges of the display panel 100.

To further improve the performance of the touch-sensing capability, the width of the common electrode blocks that serve as the RX lines at the far most end of the display panel 100 may be different from the width of other touch-sensing blocks 114 in the other areas of the panel 110. Configuring the common electrode blocks at the farthest ends of the display panel 100 as the RX lines allows for more accurate touch input recognition even from the very end portions of the active area. However, this means that the location of the common electrode blocks that serve as the TX line will shift away from the edges by the width of the common electrode blocks serving as the RX line at the edges. Also, each TX line does not fully extend across the RX lines positioned at the edges. Accordingly, the width of the common electrode blocks at the edges may be narrower than the width of the common electrode blocks at other areas of the active area. For instance, the width of the common electrode blocks, measured in X-direction, at the edges of the active area may be ½ of other common electrode blocks.

To improve the touch-sensing accuracy at the upper and lower edges of the display panel 100, the common electrode blocks at the upper and lower edges of the display panel 100 can have a reduced width, measured in Y-direction, as compared to other common electrode blocks at other areas of the display panel 100. This way, narrower TX lines can be provided at the top and bottom edges of the display panel 100. The number of TX and RX lines in the display panel 100 can be adjusted according to the arrangement and sizes of the common electrode blocks in in the active area.

Regardless of which type of touch recognition system is implemented in the display panel 100, each of the common electrode blocks are connected with at least one common signal line SL, which extends parallel to one another and routed outside the active area in the same direction as the data lines DL. Arranging the common signal lines SL parallel to each other and having them routed across the active area toward the drive ICs allows to eliminate the space for routing the common signal lines SL from the sides of the display panel, and thereby reducing the size of the bezel.

When routing the common signal lines SL across the active area, the common signal lines SL, except the ones that are connected to the common electrode blocks of the row or the column closest to the drive IC, are routed across other common electrode blocks. For instance, the common signal line SL connected to the common electrode block B1 simply extends across the common electrode blocks B4, B7 and B10 to reach the inactive area where the drive ICs are located, without being in contact with the common electrode blocks in the route.

The common signal lines SL cannot be positioned immediately above or below the common electrode blocks to directly interface with the surface of the common electrode block. If the common signal lines SL are routed on the surface of the common electrode blocks, the common signal lines SL will be in contact with multiple common electrode blocks along path toward the inactive area. This will disrupt the unique coordinates of the common electrode blocks in the self-capacitance touch recognition system or breaking the formation of TX/RX lines in the mutual-capacitance touch recognition system.

Also, when the common signal lines SL are positioned in the same layer as the pixel electrode, coupling generated between the common signal lines SL and the pixel electrode may cause various display defect when the common signal lines SL are used to modulate the common electrode blocks during the touch-sensing period. Accordingly, when the common signal lines SL and the pixel electrodes are placed in the same layer, it is difficult to reduce the space between the common electrode blocks and the pixel electrode for higher storage capacitance. While the common signal lines SL can be placed under the split area between the two adjacent common electrode blocks for lowering the coupling capacitance, such unwanted fringe field may be generated between the common electrode blocks and the common signal lines SL. Such fringe field can affects the LC molecules, and lead to undesired light leakage. Thus, in order to route the common signal lines SL across the active area of the display panel 100, the plane level of the common signal lines SL should be different from the plane levels of the pixel electrode and the common electrode blocks.

Placing the common signal lines SL between the layer of pixel electrode and the layer of common electrode blocks poses similar problems. In such a configuration, an insulation layer should be provided between the layer of the common electrode blocks and the layer of common signal lines SL. The thickness of the insulation layer interposed between the pixel electrode and the common electrode blocks is limited in the IPS or the FFS mode LCD device, and it also limits the thickness of the common signal lines SL as it cannot be greater than the thickness of the insulation layer between the layer of pixel electrodes and the layer of common electrode blocks.

For instance, when the thickness of the insulation layer interposed between the pixel electrode and the common electrode blocks is about 3000 Å, the thickness of the common signal lines SL is limited to about 2500 Å if the common signal lines SL are to be placed between the common electrode blocks and the pixel electrode. Since the thickness is one of the factors affecting the resistance of the common signal lines SL, the limitation as to the thickness of the common signal lines SL effectively limits the performance of the common signal lines SL in transmitting signals between the drive ICs and the common electrode blocks, especially as the size of the display area in the device becomes larger.

Accordingly, in the embodiments of the display panels described in the present disclosure, the common signal lines SL are positioned under the array of TFTs such that they are sufficiently distanced away from the pixel electrode and the common electrode blocks provided above the array of TFTs. Such a setting provides more freedom as to the width and thickness of the common signal lines SL. To this end, one or more planarization layer is provided between the common signal lines SL and the common electrode blocks, and the common signal lines SL are connected to the corresponding common electrode blocks via bypass lines, which are connected to both the common signal lines SL and the common electrode blocks through the contact holes in the planarization layers. In such settings, each of the common signal lines SL connected to a common electrode block can be routed across the active area without contacting other common electrode blocks placed along its route. The common signal lines SL can simply bypass the common electrode blocks along the path to the data drive-IC 120 in the inactive area.

Figure 4A:
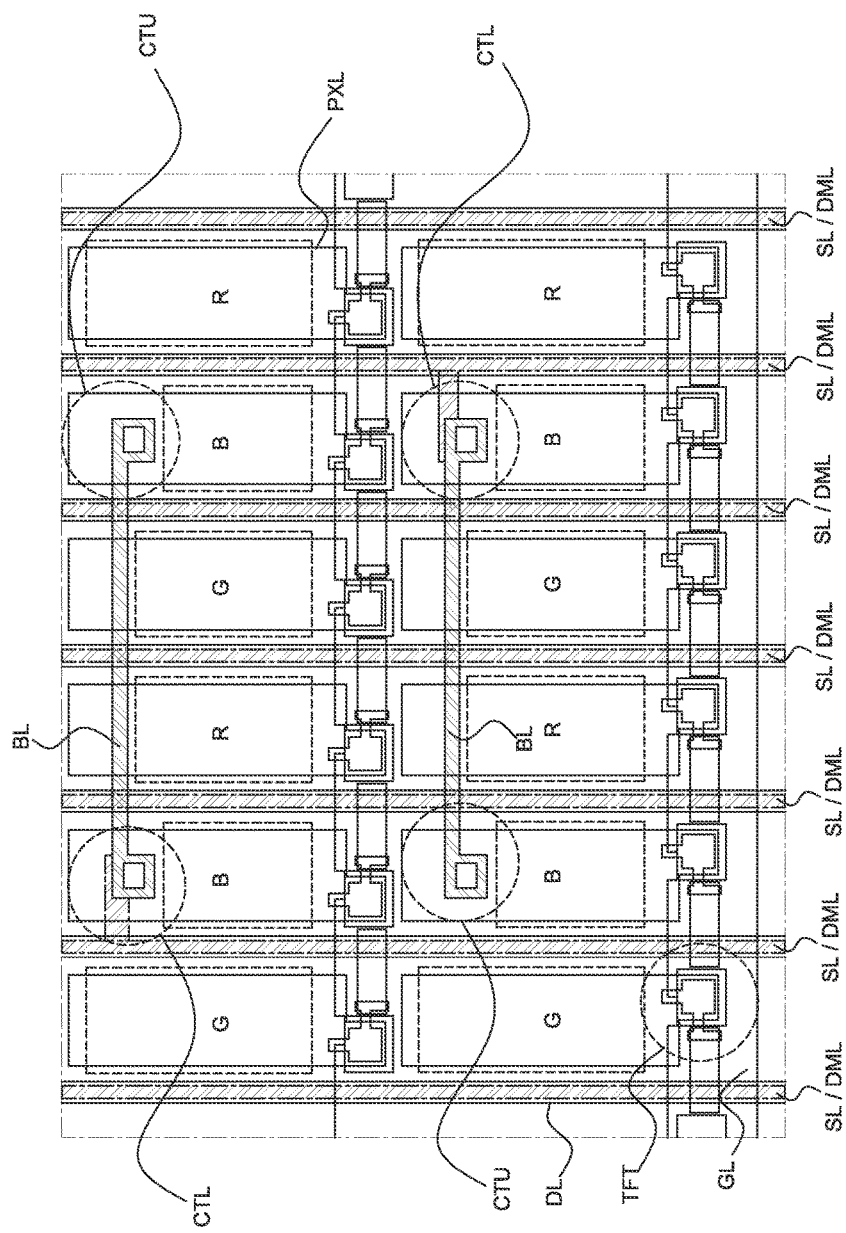
FIG. 4A is a plan view showing an exemplary configuration of a plurality of common signal lines and a plurality of bypass lines in a display panel, according to an embodiment of the disclosure.

FIG. 4A is a plane view that illustrates an exemplary configuration of the common signal lines SL and the bypass lines in a matrix of pixel regions in the display panel, according to an embodiment of the present disclosure. Referring to FIG. 4A, the data lines DL and the gate lines are arranged to intersect each other, thereby defining a matrix of pixel regions in the active area of the display panel 100. The common signal lines SL are arranged to extend in the same direction as the data lines DL. Each common signal line SL is positioned to at least partially overlap with a data line to minimize reduction in the aperture ratio of the pixel regions by the common signal lines SL. Each pixel region is provided with a TFT. As will be described below, a dummy line DML may be placed underneath some of the data lines DL in place of the common signal line SL.

The TFT may be formed in the bottom gate structure with the source and drain provided on the opposite side of the semiconductor layer. The source electrode of the TFT extends from or otherwise connected to the data line DL, and the drain is connected to the pixel electrode PXL provided in the corresponding pixel region. The pixel electrode PXL is provided with a plurality of slits (not shown) to generate fringe field in conjunction with the overlapping common electrode block (not shown).

The common signal lines SL are placed under the TFTs of the pixels, and each of the common electrode blocks is connected to the ones of the corresponding common signal lines SL via contact holes (i.e., lower contact hole, upper contact hole) through the planarization layers formed over the TFTs. In this configuration, each common signal line SL is connected to at least one bypass line BL that is connected to the corresponding common electrode block. The bypass line BL may be arranged in a transverse direction to the common signal lines SL such that a bypass line BL extends across from one pixel region to another pixel region of the same row. That is, the connection between the bypass line BL and the common signal line SL can be via a contact hole provided in one pixel region, and the connection between the bypass line BL and the common electrode block can be made via a contact hole provided in another pixel region. As shown in FIG. 4A, aperture ratio of the pixel regions varies due to the contact holes CTL/CTU and the bypass lines BL.

Figure 4B:
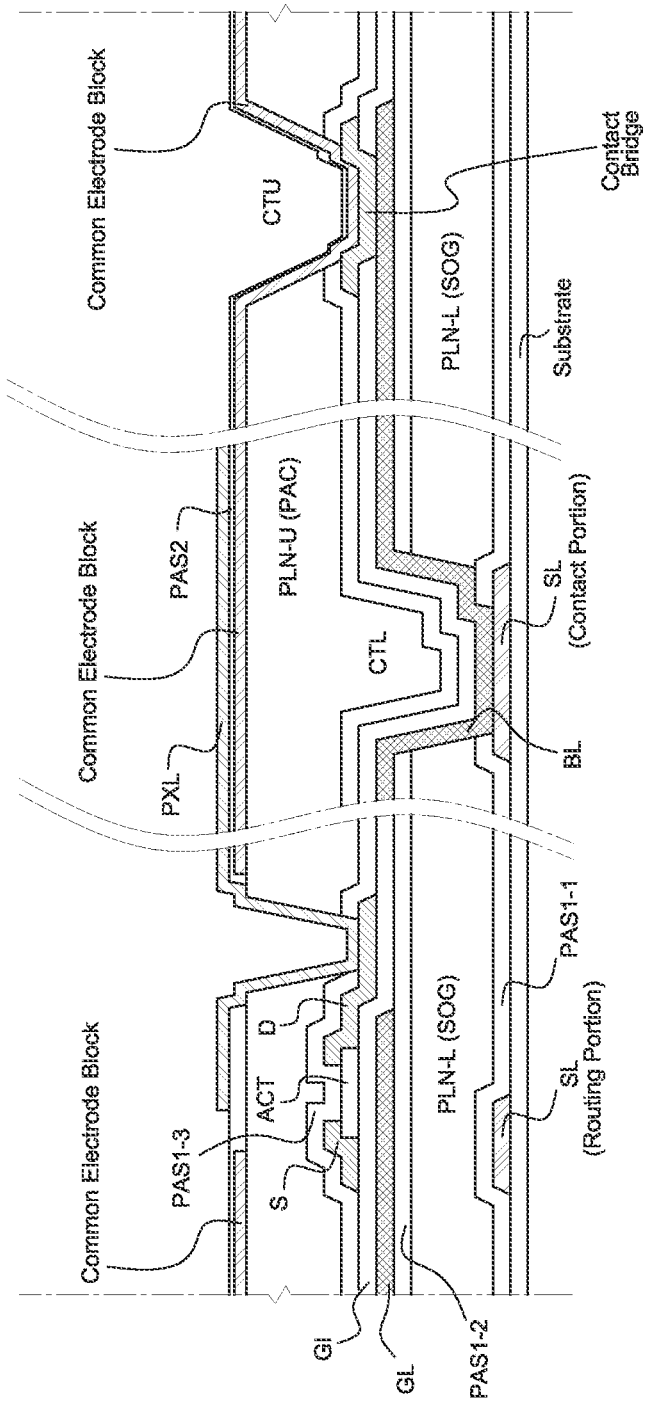
FIG. 4B is a cross-sectional view showing an exemplary configuration for connecting a common signal line to a transparent electrode block via a bypass line.
Figure 4C:
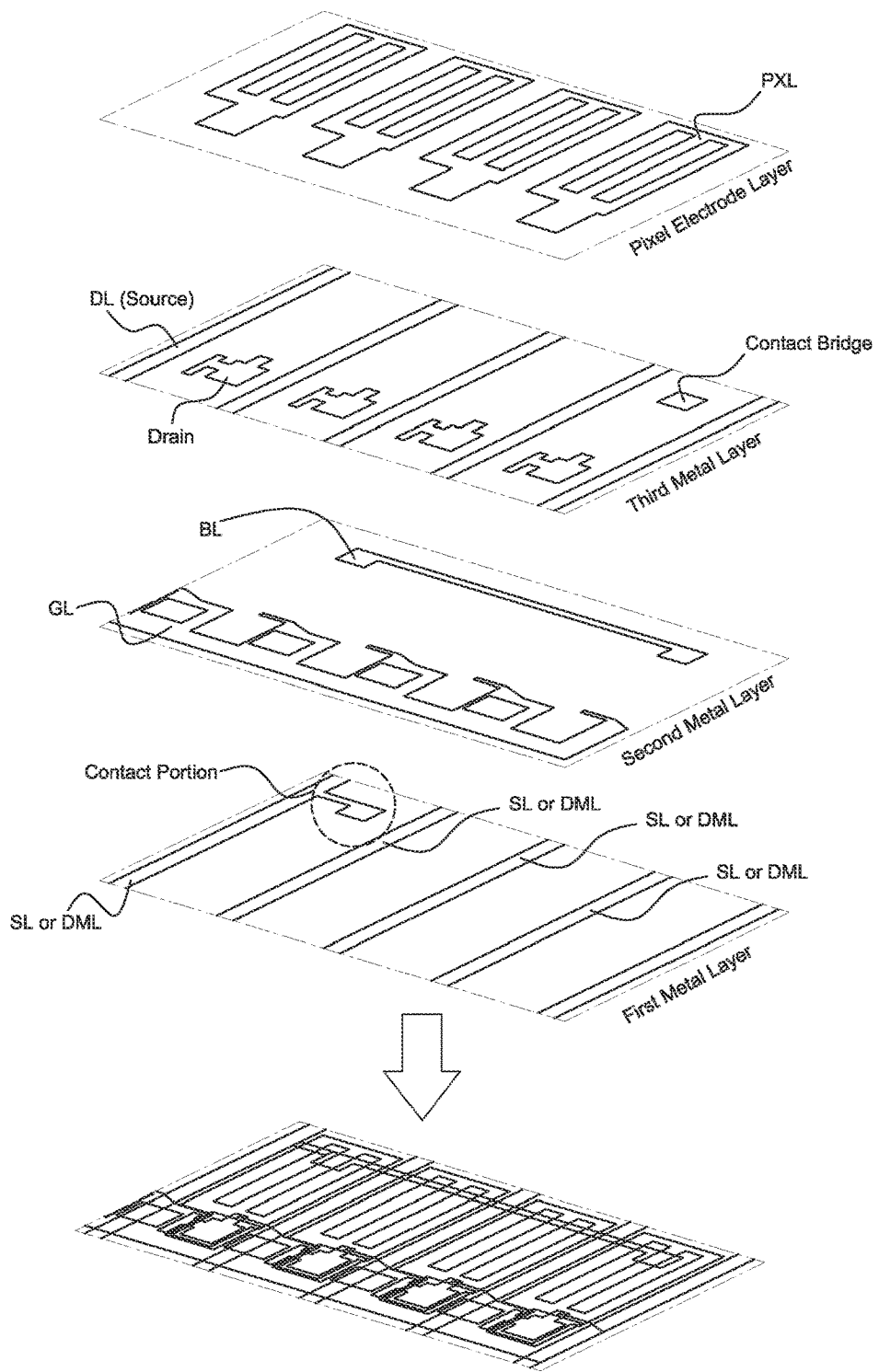
FIG. 4C is a schematic illustration showing the order in which the metal layers forming the common signal lines, the bypass lines, the gate lines, the data lines and the source/drain of the thin-film transistor, according to an embodiment of the present disclosure.

FIG. 4B is a cross-sectional view showing an exemplary configuration for connecting a common signal line to a transparent electrode block via a bypass line BL. FIG. 4C illustrates the order in which the metal layers are disposed over one another to form the common signal lines SL, the bypass lines BL, the gate lines GL, the data lines DL and the source/drain of the TFT in the display panel 100. The metal layer used in forming the common signal lines SL may be referred to as the first metal layer, and for convenience of explanation, the order of other metal layers may be referred in reference to the first metal layer.

Referring to FIGS. 4B and 4C, the common signal lines SL are formed with the first metal layer on the substrate. It should be noted that the term "first metal layer" do not necessarily mean that the layer is comprised of a single metal layer. Rather, the term "first metal layer" refers to a metal layer or a stack of metal layers capable of being patterned on a surface and insulated from another layer of metal layer or another stack of metal layers by an insulation layer. Similar to the first metal layer, other subsequent metal layers (e.g., the second metal layer, the third metal layer) in the embodiments of the present disclosure may be formed of a stack of multiple layers of different metals.

In some embodiments, the first metal layer may be formed of a stack of a copper layer (Cu) and a molybdenum-titanium alloy layer (MoTi). The second metal layer may also be a stack of a copper layer (Cu) and a molybdenum-titanium alloy layer (MoTi). The third metal layer may be a stack of a molybdenum-titanium alloy layer (Moti), copper layer (Cu) and another molybdenum-titanium alloy layer (Moti). The copper layer may be thicker than the molybdenum-titanium alloy layer in each of the metal layers. The second metal layer may be referred to as the gate metal layer and the third metal layer may be referred to as the source/drain metal layer.

To provide an array of TFTs on the common signal lines SL, a lower planarization layer PLN-L is provided over the common signal lines SL. The thickness of the lower planarization layer PLN-L may vary depending on the thickness of the common signal lines SL. For example, the thickness of the common signal lines SL may range from about 2500 Å to about 7500 Å, and more preferably from about 3500 Å to about 6500 Å, and more preferably from about 4500 Å to about 5500 Å. The thickness of the lower planarization layer PLN-L may range from about 1 µm to 1 µm, and more preferably from about 1 µm to 3 µm, and more preferably from about 1 µm to 2 µm. The thickness of the planarization layer that covers the common signal lines SL can vary based on various factors, such as the dielectric property, material, fabrication process, and more.

Since the array of TFTs is to be fabricated on the lower planarization layer PLN-L, the material for the lower planarization layer PLN-L cannot be the photo-acryl, which is conventionally used for the planarization layer over the TFTs. Some of the process for fabricating the TFTs may be carried out in high-temperature, and thus the lower planarization layer PLN-L should be able to sustain its quality even under such a high temperature conditions of the TFT fabrication processes. For example, some of the processes during the fabrication TFTs with oxide semiconductor layer, such as IGZO (indium-Gallium-Zinc-Oxide), may be carried out at about 350 degrees Celsius or higher. TFTs with poly-silicon semiconductor layer may require a processing at even higher temperature. As such, the lower planarization layer PLN-L may be formed of material that can maintain the planarizing functionality at more than 350 degrees Celsius, and more preferably at 380 degrees Celsius and higher. To this end, silicon based inorganic material with high thermal stability is desirable for the lower planarization layer PLN-L (i.e., SOG layer). The material should also be suitable for processes for covering over the common signal lines SL as a planarization layer. For instance, inorganic material with high thermal stability may be disposed over the common signal lines SL as the lower planarization layer PLN-L by using the spin-on-glass method, slit coating method or other suitable coating methods. After the inorganic material is coated over the common signal lines SL, curing process may be performed.

A passivation layer PAS1-1, which may serve as a capping layer, can be provided between the common signal lines SL and the lower planarization layer PLN-L. On the lower planarization layer PLN-L, the gate lines GL and the gates G of the TFTs are provided with the second metal layer. The bypass lines BL are also provided on the lower planarization layer PLN-L by patterning the second metal layer. The semiconductor layer ACT (e.g., oxide, LTPS, a-Si) is patterned on the gate insulation layer GI, which may cover the gate lines GL, the gates G of the TFTs and the bypass lines BL. The data line DL, which is connected to the source S of the TFT, is formed with the third metal layer. The drain D of the TFT is in contact with the pixel electrode PXL through a contact hole in the upper planarization layer PLN-U.

Further, another passivation layer PAS1-2 may be provided between the lower planarization layer PLN-L and the array of TFTs. The passivation layer PAS1-2 may provide protection for components that are placed on the lower planarization layer PLN-L from undesired fumes (e.g., hydrogen fumes) from the lower planarization layer PLN-L.

The material and configuration of the passivation layer (i.e., PAS1-2) between the lower planarization layer PLN-L and the array of TFT can vary depending on the semiconductor layer (i.e., active layer) of the TFTs in the array. For example, the passivation layer PAS1-2 may be a silicon nitride layer, a silicon oxide layer or stacks of such layers. In some suitable embodiments, the passivation layer PAS1-1 under the lower planarization layer PLN-L and the passivation layer PAS1-2 on the planarization layer PLN-L may be provided in a substantially the same thickness, and may be formed of the same inorganic material. For instance, both the passivation layer PAS1-1 and the passivation layer PAS1-2 may be silicon nitride layer of about 2000 Å.

In particular, at least some of the TFTs provided on the lower planarization layer PLN-L may include the oxide metal semiconductor layer such as indium-gallium-zinc oxide (IGZO), and a silicon nitride layer can be interposed between the lower planarization layer PLN-L and the TFTs formed thereon. To maximize the protection from the hydrogen fume, the contact holes for connecting a bypass line BL and a common signal line SL may be formed prior to forming the passivation layer PAS1-2 on the lower planarization layer PLN-L. That is, the contact hole can be formed after the formation of lower planarization layer PLN-L, and the passivation layer PAS1-2 can be formed over the lower planarization layer PLN-L with the contact hole already formed therein. In this way, the passivation layer PAS1-2 will cover even the surfaces (i.e., the side wall) within the contact hole. An etching process can be performed to open the actual contact region of the common signal line SL for connection with the bypass line BL.

The connection between a bypass line BL and the corresponding common electrode block may be made via a contact bridge placed on the bypass line BL. More specifically, the contact bridge can be formed with the third metal layer and placed at the contact region of the bypass line BL exposed through the upper contact hole CTU in the upper planarization layer PLN-U.

To provide a planar surface for placing the common electrode blocks, the upper planarization layer PLN-U is provided over the TFTs and the bypass lines BL. As shown, a passivation layer PAS1-3 formed of inorganic material, such as SiNx and/or SiOx, may be interposed between upper planarization layer PLN-U and the third metal layer. Another passivation layer, PAS2, is interposed between the common electrode blocks and the pixel electrodes PXL provided on the upper planarization layer PLN-U.

When patterning the first metal layer on the substrate to provide the common signal lines SL across the active area of the display panel, a plurality of external signal lines can also be patterned in the inactive area of the display panel 100. The gate drive IC 120 of the display panel 100 may be provided as a gate-in-panel (GIP) type, which is implemented with a plurality of TFTs directly formed at the inactive area of the display panel 100. In such cases, the TFTs of the GIP circuit are formed on the lower planarization layer, similar to the array of TFTs in the active area of the display panel 100. Here, the conductive lines for supplying external signals to the GIP circuit can be provided underneath the lower planarization layer PLN-L.

The external signal lines may be positioned to extend across under the plurality of shift registers of the GIP circuit that are implemented with a number of TFTs. The external signal lines can be connected to the parts of the GIP circuit via contact holes through the lower planarization layer PLN-L. The external signal lines routed underneath the GIP circuit may include various clock signal lines, power signal lines (e.g., VSS, VDD), reset signal lines and more. In some embodiments, signal line for transmitting the common voltage signal may be routed in the inactive area under the GIP circuit. Routing at least some of the external signal lines directly under the GIP circuit allows to reduce the bezel size even further.

At least one common signal line SL is required for each of the common electrode blocks. Thus, the minimum number of common signal lines SL required in the display panel would be equal to the number of common electrode blocks. Each of the common electrode blocks may be connected with extra common signal lines SL for more reliable connection. If desired, a common signal line SL can be provided under each and every data lines DL, and they may be connected to the common electrode blocks accordingly to implement either the self-capacitance touch sensor, mutual-capacitance touch sensor or to provide various other functionalities in the display panel 100.

In addition to providing more reliable connection to the common electrode blocks, a common signal line SL under each and every data lines DL would allow to reduce the load on each common signal line SL. Further, with a common signal line SL being placed under every data lines DL, the capacitance between the data line DL and the common signal line SL would be uniform throughout the display panel 100. However, placing a common signal line SL under every data lines DL and connecting it to the common electrode block may be accompanied by some side effects, for instance, decrease in the aperture ratio of the pixel regions.

Benefits from placing a common signal line SL under every data lines DL and connecting it to the common electrode block above may not outweigh the side effects. As such, the common signal lines SL may be placed under some of the data lines DL, and dummy lines DML may be placed under remainder of the data lines DL. The dummy lines DML are formed in the same metal layer as the common signal line SL, but they are not connected to the drive-IC, at least on their own.

In order for the data lines DL to have uniform data line capacitance, dummy lines DML may be provided in the display panel 100, so that every data lines DL in the display panel are overlapped with either the common signal line SL or the dummy line DML as was shown in FIG. 4A. The dummy lines DML may or may not be connected to the common electrode blocks so long as they do not disrupt the configuration of common electrode blocks set by the common signal lines SL for implementing a certain feature in the display panel 100.

In some embodiments, the dummy lines DML can be provided as floating lines or ground lines, which are not connected to any of the common electrode blocks above. Since the dummy lines DML do not need to be connected to the bypass lines BL, the number of total bypass lines BL needed in the display panel 100 can be greatly reduced, which would improve overall brightness of the display panel 100.

The dummy lines DML in floating state may cause electrostatic during manufacturing of the display panel. Thus, some or all dummy lines DML can be connected to the common electrode blocks in a similar way as the common signal lines SL in some embodiments of the display panel 100. In such cases, a dummy line DML should not interconnect multiple common electrode blocks that are individually communicating with the drive IC via a separate one or a set of common signal lines SL.

Figure 5:
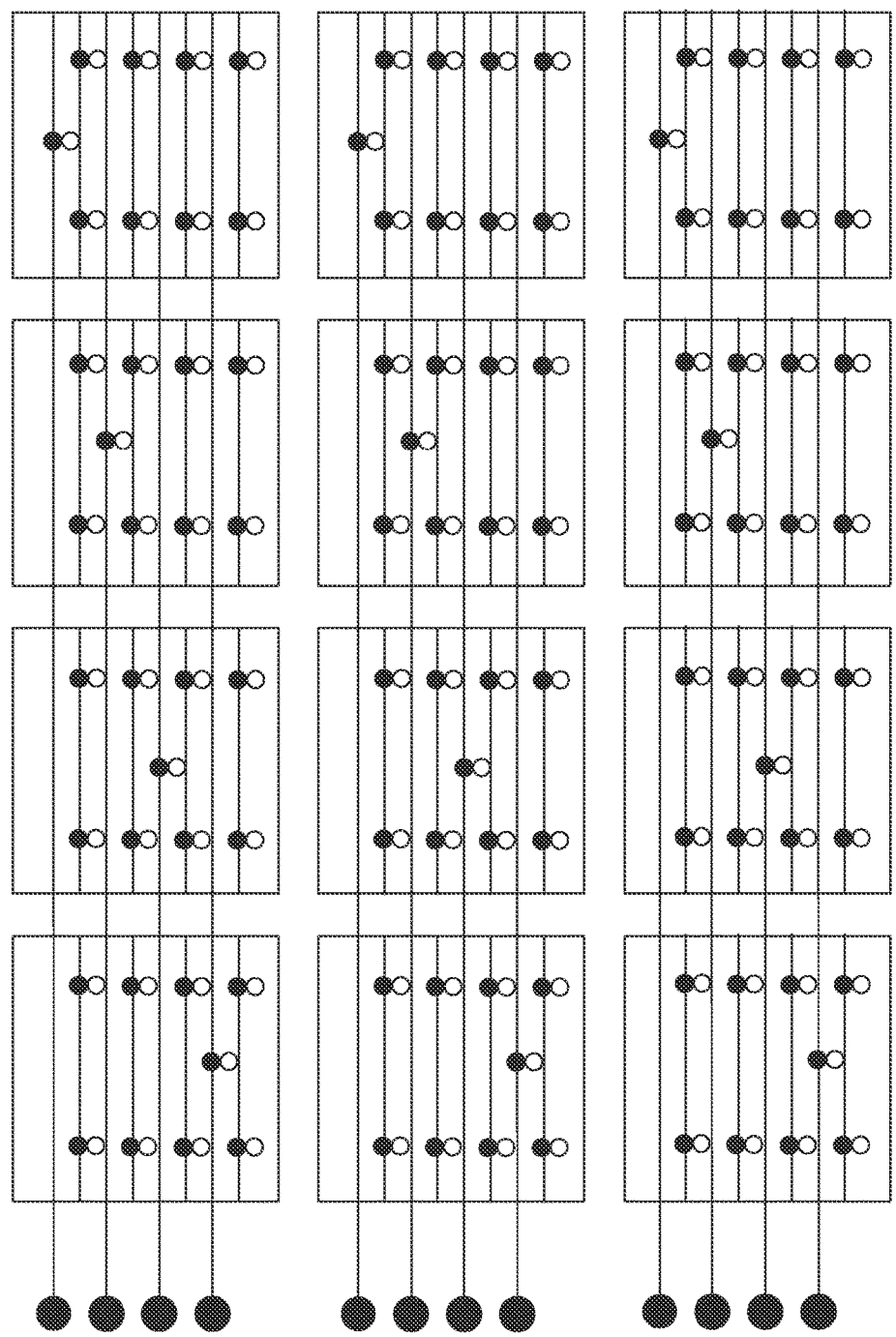
FIG. 5 is a schematic illustration showing an exemplary configuration of the common signal lines and the dummy lines in the display panels, according to an embodiment of the present disclosure.

FIG. 5 illustrates exemplary configuration of a display panel provided with a plurality of dummy lines DML, in which the dummy lines DML are selectively connected to a corresponding ones of common electrode blocks. The connection between the dummy lines DML to the common electrode block can be made through the bypass line in the same way as the common signal lines SL. As shown, the dummy lines DML are connected to the common electrode blocks thereon, but they do not interconnect the common electrode blocks. To this end, the dummy lines DML may be divided into several pieces such that a dummy line DML under a common electrode block does not extend over to another common electrode block as depicted in FIG. 5.

In the example shown in FIG. 5, a dummy line DML is connected to the corresponding common electrode block at multiple locations using multiple bypass lines BL. Likewise, a common signal lines SL may also be connected to the corresponding common electrode block at multiple locations through multiple bypass lines BL. In addition to providing uniform data line capacitance in the display panel 100, the dummy lines DML are connected to multiple locations of the common electrode blocks can serve as a current path within the corresponding common electrode block.

In FIG. 5, the common signal lines SL extends across multiple common electrode blocks, even though each common signal line SL is connected with only one of the common electrode blocks. In some embodiments, the dummy lines DML may also be extended across multiple common electrode blocks similar to the common signal line SL. Similar to the common signal lines SL, each dummy line DML may be connected to multiple locations of one of the common electrode blocks, and simply pass across other common electrode blocks.

In the examples depicted in the previous figures, either a common signal line SL or a dummy line DML was placed under each data line DL. However, it should be appreciated that a common signal line SL and a dummy line DML may be provided under a single data line DL. For example, a common signal line SL may be extended under a data line DL and connect to a common electrode block. The common signal line SL would end at a point where it is connected to the common electrode block. From thereon, a piece of conductive line disconnected from the common signal line SL can then extends under the data line DL as a dummy line DML.

Although the dummy lines DML may or may not be connected to the common electrode block, each one of the common signal lines SL is connected to one of the common electrode blocks by one or more bypass lines BL. In this regard, one end of a bypass line BL is connected to the common signal line SL via a lower contact hole CTL through the lower planarization layer PLN-L and the passivation layers PAS1-1/PAS1-2 thereunder. The other end of the bypass line BL is connected to the common electrode block via the upper contact hole CTU through the upper planarization layer PLN-U and the passivation layer thereunder. The bypass line BL may be directly contact the common signal line SL through the lower contact hole CTL. A contact bridge, formed of the same metal layer as the source/drain metal of the TFT, may be interposed between the bypass line BL and the common electrode block. The common electrode block can come in contact with the contact bridge through the upper contact hole CTU so as to electrically connect the common electrode block and the bypass line BL.

Referring back to FIGS. 4A-4C, the common signal line SL includes a routing portion extending in the same direction as the data line DL and a contact portion projecting out from the routing portion toward the lower contact hole CTL. The end of the contact portion may be enlarged for easier contact with the bypass line through the lower contact hole CTL. Likewise, the ends of the bypass line BL corresponding to the lower contact hole CTL and the upper contact hole CTU may be wider than its interim section.

In the example shown in FIGS. 4A-4C, the contact portion of the common signal line SL is depicted as being extended into the pixel region that is immediately adjacent to the routing portion of that common signal line SL. However, the configuration of the contact portion is not limited as such, and it may be extended further into other pixel regions. If dummy lines DML are disposed in the display panel, the dummy lines DML under each data line may be provided in divided pieces so as to provide a passage for the contact portion to extend across the dummy lines DML.

In embodiments where dummy lines DML under some of the data lines DL are connected to the corresponding ones of the common electrode blocks, the dummy lines DML would also include a routing portion extending parallel to the data lines and a contact portion projecting out from the routing portion to be connected to a bypass line. The contact portions of the dummy lines DML may also be transversely extended across several pixel regions. In this case, other dummy lines DML under the data lines may be provided in divided pieces so as to provide a passage for the contact portion of the dummy line DML. It should be noted that the contact portion of a dummy line DML can be in contact with other dummy lines DML along the way as long as those dummy lines DML are not connected to a different common electrode block.

As mentioned, the common signal lines SL are routed across the active area of the display panel 100 along the data lines DL. This allows the routing portion of each common signal line SL to be at least partially overlap with the data line DL provided thereon. However, the contact portion transversely projected out from the routing portion of the common signal line SL may not be covered under the data line DL.

Also, the bypass lines BL cannot be positioned to overlap with the gate lines GL because the bypass lines BL are formed of the second metal layer, which is the same non-transparent metal layer of the gate lines and the gate electrode of the TFTs. In LCD devices, the bypass lines BL would block the light from the light source (e.g., backlight) to pass through, effectively reducing the aperture of the pixels. Even for self-light emitting display such as the OLED display, the bypass lines BL can reflect external light and make it difficult to see the images on the screen. Thus, the contact portion of the common signal line SL as well as the bypass lines BL is concealed under a masking layer BM in a similar way as the gate lines GL and data lines DL are concealed under the masking layer BM. The same applies to the contact portion of the dummy lines DML and the bypass lines BL connecting the dummy lines DML to the corresponding ones of the common electrode blocks.

Since the masking layer BM defines the aperture ratio of the pixels, covering the bypass lines BL results in reduction in the aperture ratio of the pixels where the bypass lines BL are arranged therein. Because at least one bypass line BL is needed to connect a common signal line SL to the common electrode block, each pixel group sharing a common electrode block will include pixels with different aperture ratios. For instance, the aperture ratio of the pixel region with the lower contact hole CTL may differ from the aperture ratio of the pixel region with the upper contact hole CTU. Also, the aperture ratio of the pixel regions where the interim section of the bypass line is laid across may be different from the aperture ratio of the pixel regions accommodating the lower or the upper contact holes. Further, some pixels may not be accommodating any of the contact holes or the bypass line, and provided with a greater aperture ratio than the pixels of the above. Herein, the pixels with a reduced aperture ratio due to the contact holes or the bypass lines BL may be referred to as the "bypass pixels." The pixels in which the aperture ratio is not reduced by the contact holes or the bypass lines BL may be referred to as the "normal pixels."

Referring back to FIG. 4A, the lower contact hole CTL for connecting the common signal line SL to the bypass line BL is provided in one of the pixel region, and the upper contact hole CTU for connecting the bypass line BL to the common electrode block is provided in another pixel region. The lower contact hole CTL and the upper contact hole CTU reduces the aperture of the pixels. Thus, the pixels accommodating the lower contact hole CTL and the upper contact hole CTU have smaller aperture ratio then the intermediate pixels in between those two pixels.

To improve efficiency, the lower contact hole CTL and the upper contact hole CTU may be provided at certain selective pixels. For example, the lower contact hole CTL and the upper contact hole CTU may be provided in blue pixel regions. Luminance of blue pixels tends to be lower than the luminance of green or red pixels, even when they are provided in the same size. With a poor luminance/size ratio, the actual amount of luminance decreased by placing the contact holes is less in blue pixels as compared to placing the contact holes in red and green pixels. Therefore, in some embodiments, the lower contact hole CTL and the upper contact hole CTU at the opposite ends of the bypass lines may be arranged in the blue pixel regions.

As shown in the examples of FIG. 4A, the blue pixel regions for accommodating a lower contact hole CTL and an upper contact hole CTU for connection of a bypass line BL may be the pixels in the same row. The intermediate pixel regions between the blue pixel region with the lower contact hole CTL and the blue pixel region with the upper contact hole CTU in the same row includes pixel regions of other colors, such as a red pixel region, a green pixel region and/or a white pixel region.

A blue pixel region without a contact hole may also be included among the intermediate pixel regions between the two blue pixels accommodating the contact holes. That is, the interim section of a bypass line BL between the blue pixel region with the lower contact hole CTL and the blue pixel region with the upper contact hole CTL may be laid across one or more blue pixel regions, which do not accommodate neither the lower contact hole CTL nor the upper contact hole CTU therein.

It should be reminded that the bypass line BL and the gate lines GL are provided in the same plane, and thus they are not arranged to overlap one another. As such, the aperture ratio of the intermediate pixel regions is also reduced by the bypass lines BL extending between the lower contact hole CTL and the upper contact hole CTU. In order to minimize the number of bypass pixel regions, that is, the pixel regions of which the aperture ratio is reduced due to the bypass line BL, the length of the bypass lines BL should be kept minimal. For this reason, the lower contact hole CTL and the upper contact hole CTU for each of the bypass lines BL may be provided in two closest blue pixel regions of the same row. In other words, the blue pixel region, where the upper contact hole CTU is formed in, may be the first blue pixel region of the same row, which comes after the blue pixel region with the lower contact hole CTL.

Depending on the size and location, considerable difference in the aperture ratio can result between the bypass pixels and the normal pixels. The portion of the bypass line BL corresponding to the contact holes for connecting the bypass line BL to the common signal line SL and to the common electrode block may be larger than other portions of the bypass line BL. As such pixels where the contact holes in the lower planarization layer PLN-L for connecting the common signal line SL to the bypass line BL and in the upper planarization layer PLN-U for connecting the common electrode block to the bypass line BL may have even smaller aperture ratio than other bypass pixels between the two. Such differences in the aperture ratio of the pixels may be visually noticeable to a naked human eye, for example as a moiré pattern or a line, especially when the pixels of different aperture ratio are arranged in a simple repeated pattern.

Since it is the difference in the aperture ratio of pixels that becomes a noticeable pattern, lessening the difference in the aperture ratio of the pixels would make the pattern less noticeable. Accordingly, in some embodiments, the masking layer BM may be configured to compensate for the loss of aperture ratio in the bypass pixels.

Figure 6A:
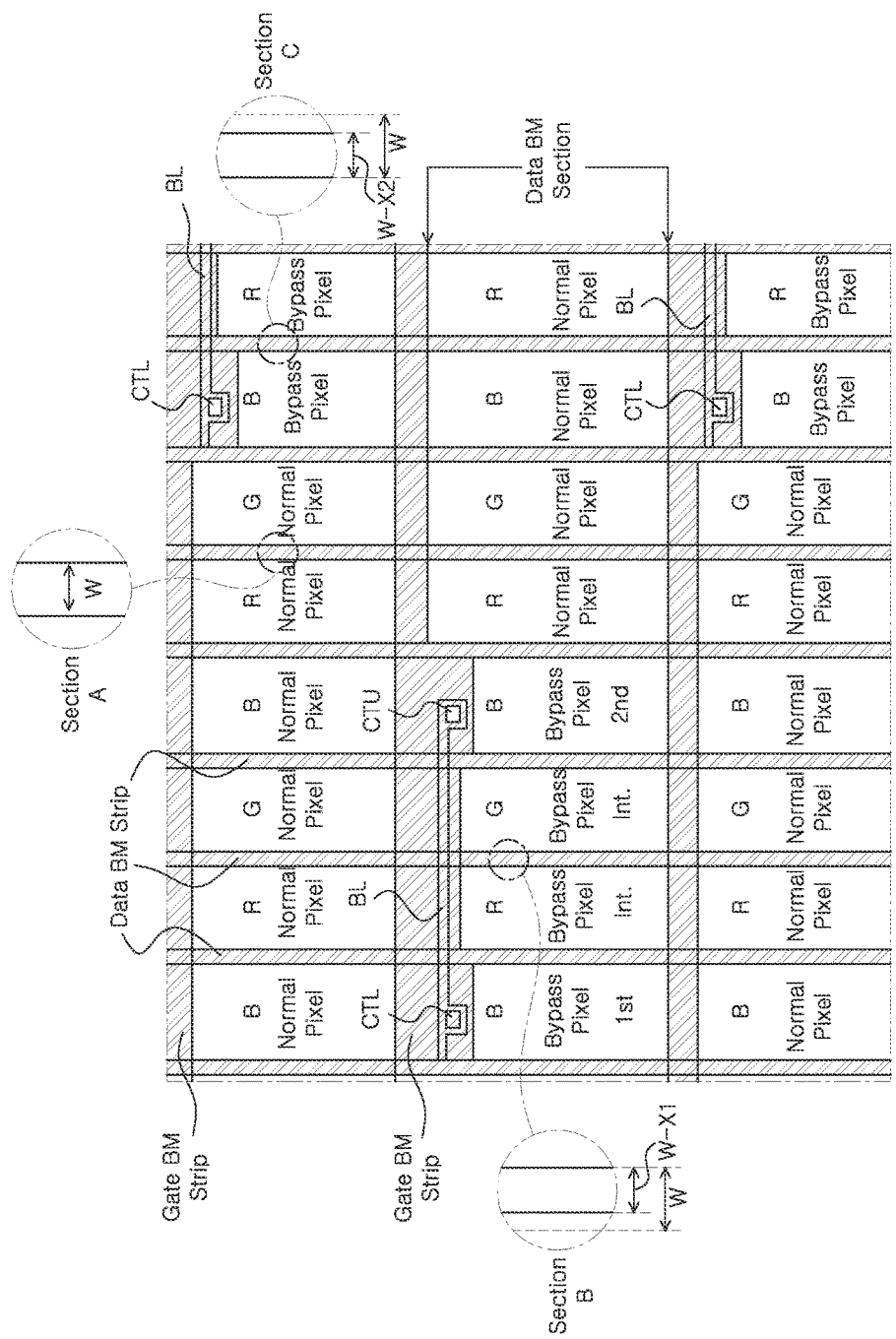
FIG. 6A is a schematic illustration showing exemplary configuration of the masking layer BM according to an embodiment of the present disclosure.

Referring to FIG. 6A, the masking layer BM includes a plurality of strips covering the data lines DL and the gate lines GL. In the present disclosure, the strips covering the data lines DL may be referred to as the data BM strip or longitudinal strip and the strops covering the gate lines GL may be referred to as the gate BM strip or the horizontal strip. These strips are arranged to intersect one another to set the aperture ratio of the pixel regions. In order to reduce the aperture ratio discrepancies between the bypass pixels and the normal pixels, selective sections of the masking layer BM abutting the pixel regions of the bypass pixels can be provided narrower than the other sections of the masking layer BM. Also, selective sections of the masking layer BM abutting the pixel regions of the bypass pixels can be shifted away or skewed from the sections abutting the normal pixels. In this way, the aperture ratio of the bypass pixels can be increased while reducing or maintaining the aperture ratio of the normal pixels. Accordingly, the difference in the aperture ratio of the bypass pixels and the normal pixels can be reduced.

For example, in embodiments where the bypass lines BL are routed across the active area in the same direction as the gate lines GL, the width and/or the alignment of the sections in the data BM strips can be adjusted to compensate the amount of aperture ratio difference between the bypass pixels and the normal pixels. In the embodiments where the bypass lines BL are routed across the active area in the same direction as the data lines GL, the width and/or the alignment of the gate BM strips can be adjusted to reduce the aperture ratio discrepancies between the bypass pixels and the normal pixels.

In the data BM strips and/or the gate BM strips, such adjustments may be made on a pixel by pixel basis. That is, the width/alignment of the strips may be different between the pixel having the lower contact hole CTL, the pixel having the upper contact hole CTU, the intermediate pixels and the normal pixels. In some cases, reducing the aperture ratio discrepancies between the pixels accommodating the contact holes and the normal pixels may alone be enough for eliminating the visually noticeable patterns to a certain level. As such, it is also possible that the width/alignment adjusted section in a strip spans continuously over several pixels. For instance, the continuous section of a gate BM strip, which spans from the pixel with the lower contact hole CTL until the pixel with the upper contact hole CTU, may have a single width and aligned in the same way, even though the aperture ratio of some of the pixels in that particular section differs from some of other pixels of that section.

In order to reduce the aperture ratio discrepancy among the pixels, some of the sections in a data BM strip can be asymmetrically arranged from other sections of the same data BM strip. At the basic level, sections of the data BM strips bordering the bypass pixels can be narrower than the sections that are only bordering the normal pixels.

In such configurations, the sections of data BM strips placed between two normal pixels may be configured to be wider than other sections of the data BM strip. That is, if any one of the pixels on the left and the right sides of the section is a bypass pixel, then the width of the data BM strip at that section may be narrower than the sections between two normal pixels. In this way, the reduction in the aperture ratio of the bypass pixels due to the bypass lines BL can be compensated to some degrees.

As shown in FIG. 6A, in some embodiments, sections in the data BM strip between two immediately adjacent normal pixels (e.g., section A) may be provided with a width "X", which is greater than the width of the sections of the data BM strip next to the first bypass pixel with the lower contact hole CTL, the second bypass pixel with the upper contact hole CTU and any of the intermediate bypass pixels between the first bypass pixel and the second bypass pixel. That is, in each of the data BM strips, data BM sections positioned next to a first bypass pixel (e.g., section C), a second bypass pixel or any intermediate bypass pixels between the first bypass pixel and the second bypass pixel (e.g., section B) is narrower than other data BM sections positioned between two immediately adjacent normal pixels (e.g., section A).

Further, in some embodiments, the data BM sections that are neighboring the first bypass pixel, the second bypass pixel or any intermediate pixels between the first bypass pixel and the second bypass pixel may have substantially the same width, which is narrower than a width of data BM sections positioned between two immediately adjacent normal pixels. Accordingly, the differences in the width of the masking layer BM can compensate the aperture ratio discrepancy due to the placement of the bypass lines BL. However, it should be noted that the differences in width between the sections of the data BM strips needs not be as large to make the aperture ratio of the pixels exactly the same.

By way of example, the width of the sections in the data BM strip neighboring the bypass pixels may be about 5 to 6 um while the width of the sections between the normal pixels may be about 7 to 8 um. The width of the data line and the width of the common signal line SL should be equal to or less than the width of any given sections in the data BM strip. In other words, the widths of the data line and the common signal line SL placed thereunder may set the narrowest width of the data BM sections next to the bypass pixels.

Figure 6B:
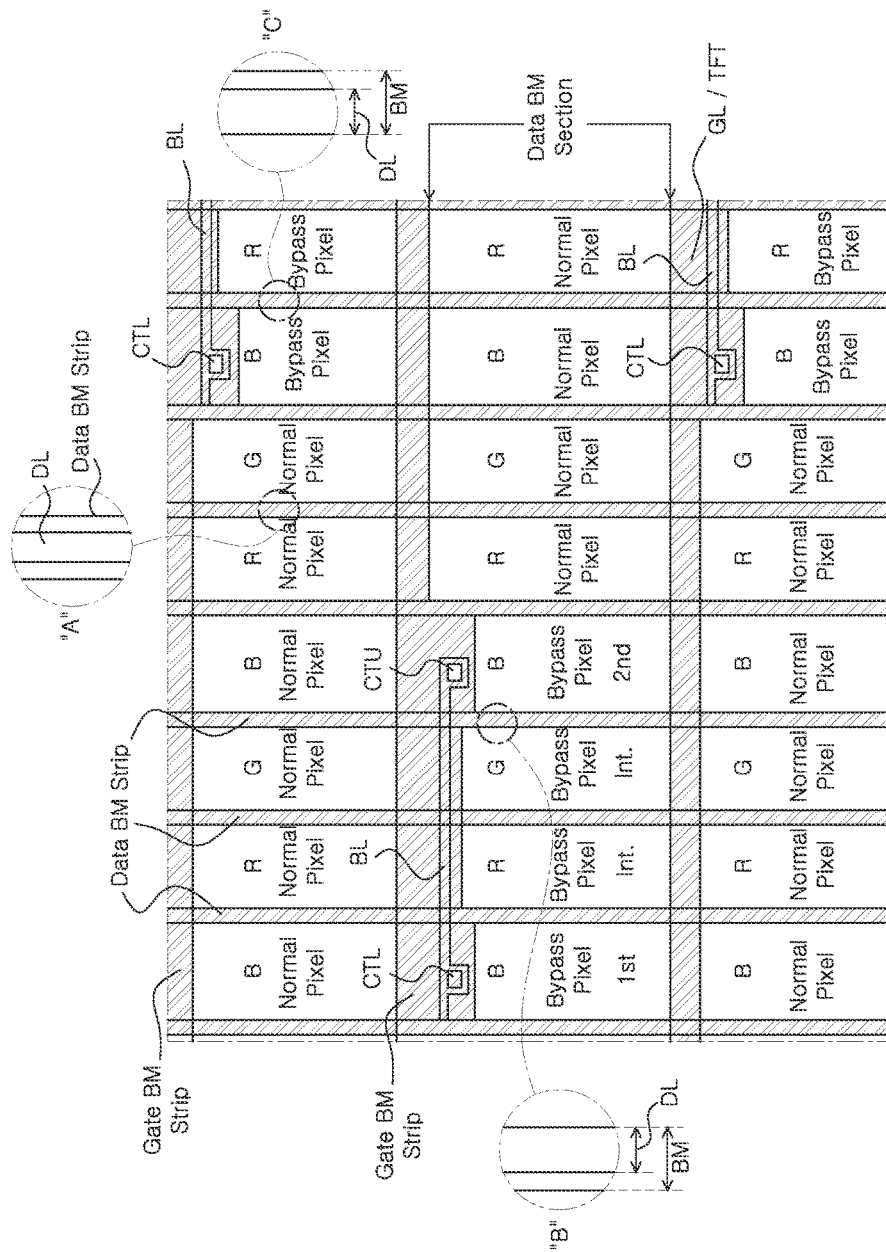
FIG. 6B is a schematic illustration showing yet another exemplary configuration of the masking layer BM according to an embodiment of the present disclosure.

As mentioned above, the pixel regions that are accommodating the contact holes may suffer the most in terms of aperture ratio by the bypass line BL. Therefore, in some embodiments, the sections of data BM strips positioned next to the pixel regions with the lower contact hole CTL and the pixels regions with the upper contact hole CTU can be configured to provide the maximum compensation of aperture ratio to those pixels. As such, in some of the embodiments, some of the data BM sections may be configured to be off-centered in relation to the center of the data line DL placed thereunder as shown in FIG. 6B. As shown in FIG. 6B, the data BM sections between a pixel with a contact hole and a normal pixel may be configured asymmetrically from other sections of the data BM strip.

Figure 6C:
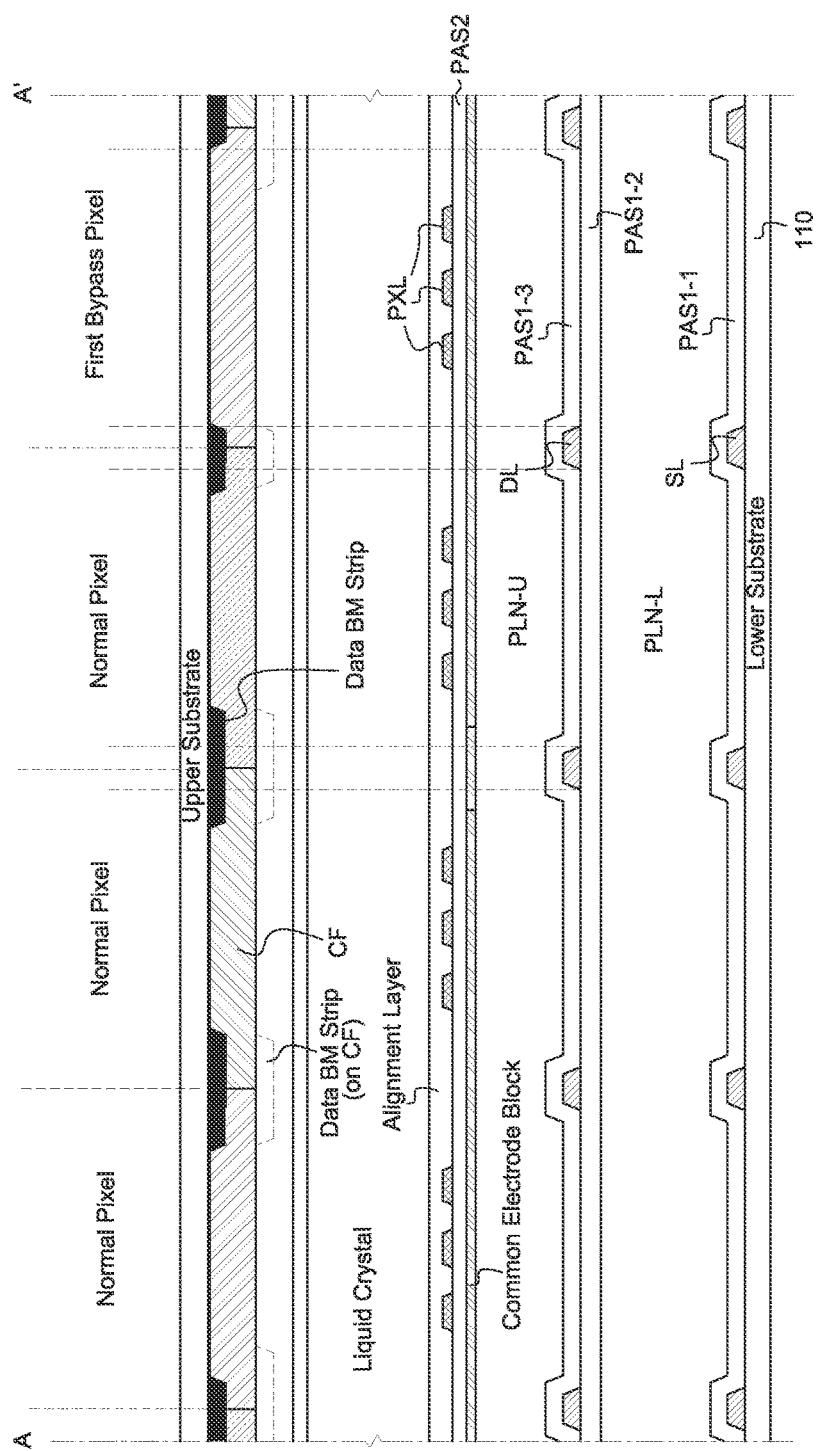
FIG. 6C is an enlarged cross-sectional view of the section A in FIG. 6B.
Figure 6D:
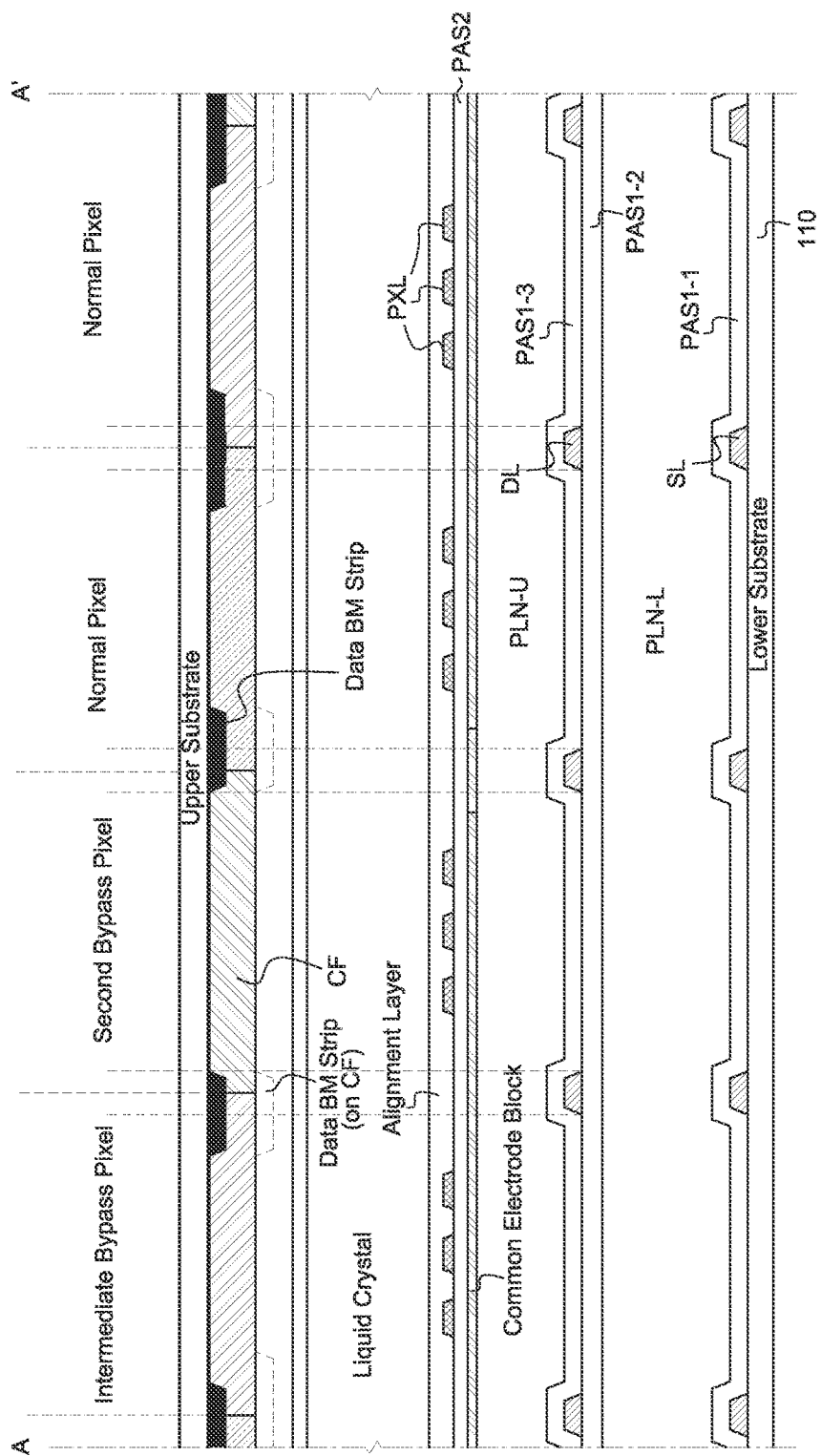
FIG. 6D is an enlarged cross-sectional view of the section B in FIG. 6B.
Figure 6E:
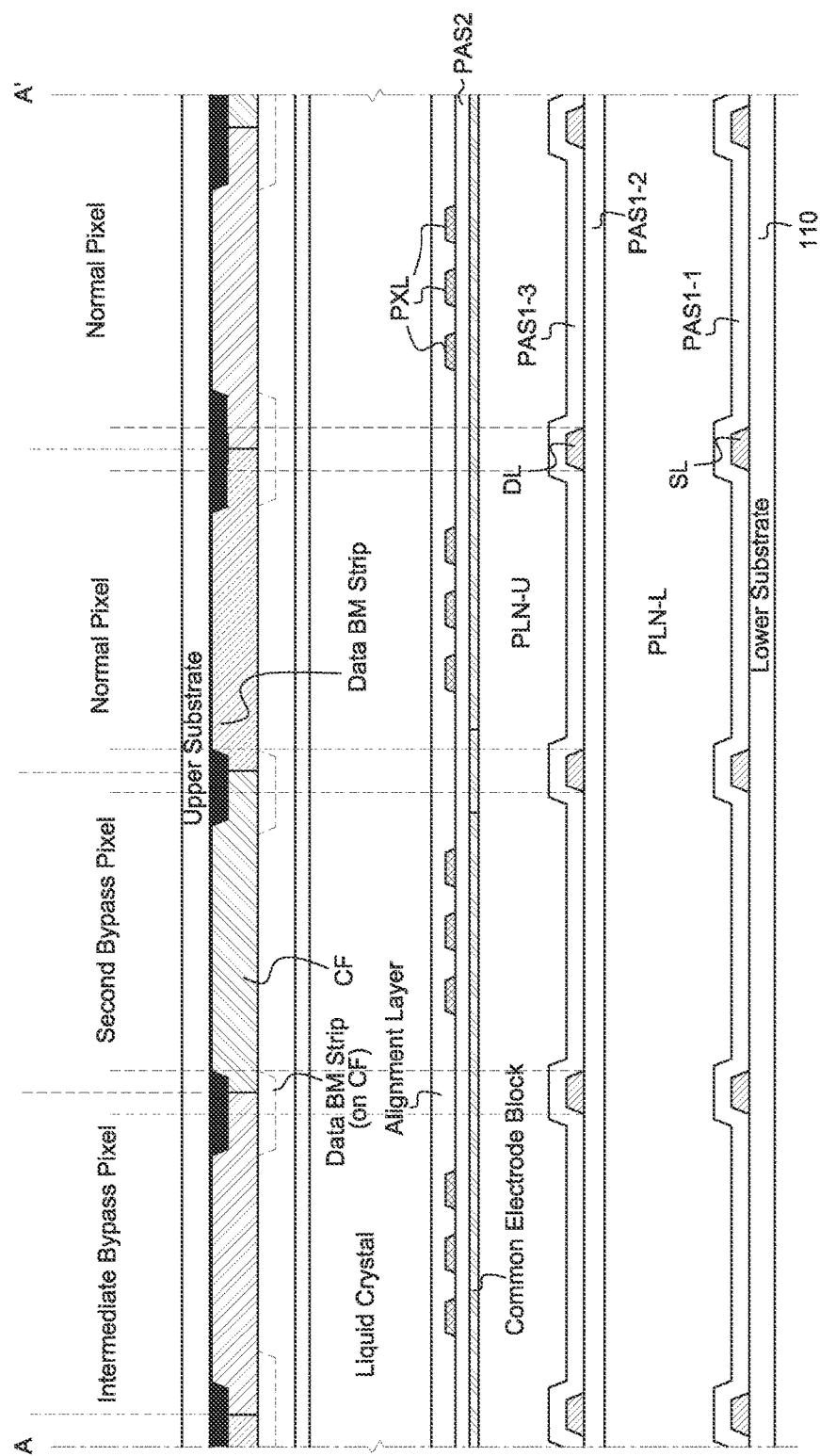
FIG. 6E is an enlarged cross-sectional view of the section C in FIG. 6B.

FIGS. 6C-6E are cross-sectional views of the sections "A", "B" and "C" in FIG. 6B, respectively. Referring to FIG. 6C, the width of the data BM sections between the normal pixels (i.e., wider portions of the data BM strips) may be greater than the width of the data line DL and the common signal line SL below. Thus, extra width of the data BM section may be distributed equally on both sides on the data line DL. By way of an example, if the data BM section between the two normal pixels has 3 um of extra width, then 1.5 um of the data BM section can overhang on each side of the data line DL and/or the common signal line SL.

As described above, the data BM sections neighboring the pixel with a contact hole is asymmetrically configured with respect to other sections of the data BM strips. In this regard, the length in which the data BM section overhangs beyond the edge of the data line DL toward the normal pixel may be greater than the length of the data BM section overhanging toward the pixel with the contact hole. As shown in FIGS. 6D and 6E, the edge of the data BM section and the edge of the data line DL toward the pixel with the contact hole can be arranged to be justly or otherwise vertically aligned to each other for the maximum aperture ratio for the pixels with the contact hole. Further, in some embodiments, the length in which the data BM section overhangs toward the pixel with a contact hole beyond the edge of the data line DL thereunder is shorter than the length in which the respective data BM section overhangs toward the intermediate bypass pixel.

Note that the BM section should cover both the data line DL and the common signal line SL there under, and thus, the edge of the data BM section and the edge of the common signal line SL may be aligned to each other toward the pixel with the contact hole. In other words, the edge of the data BM section can be aligned with either the edge of the data line DL or the edge of the common signal line SL, whichever is closer to the pixel with the contact hole.

The light from a light source may be passed through a color filter layer, which would set the color of light emitted from each of the pixel region. In some embodiments, the color filter layer and the masking layer BM may be provided on a second substrate, which is different from the first substrate where the array of TFT is located. Here, the color filter layer may be arranged such that the masking layer BM is provided further away from the first substrate than the color filter layer. Alternatively, the color filter layer and the masking layer BM may be provided on a second substrate, and arranged such that the masking layer BM is provided closer toward the first substrate where the array of TFTs is provided than the color filter layer. The light from the display can be projected from the first substrate and extracted toward the second substrate, and the masking layer BM positioned closer toward the first substrate then the color filter layer can help in suppressing light intended for one pixel leaking into an adjacent pixel.

In some embodiments, the masking layer BM may be provided closer to the light source than the color filter layer. Providing the masking layer BM closer to the light source allows to control the angle of the light from the light source to the color filter layer with more acuity, which in turn, makes it possible to suppress light leakage and/or color washout issues at a reduced width of the masking layer. Accordingly, the discrepancy in the aperture ratio between the normal pixel and the bypass pixels can be dealt with the asymmetric BM strips with a lower risk of such light leakage or the color washout issues.

Although the aperture ratio discrepancy among the pixels is the root cause of the visual artifacts, it is the repeated arrangement of such pixels, which makes the visual artifacts stand out and noticeable to a naked human eye. It would be difficult to perceive the relatively low luminance of a single isolated set of bypass pixels. However, multiple sets of bypass pixels arranged in a repeated pattern forms a pattern of low luminance region and a high luminance region in the matrix, which is much more perceptible to a naked eye.

Some pattern is inevitable in the arrangement of the bypass lines in the matrix, but the pattern can be less noticeable when it becomes complex enough.

Here, the basic idea is to provide variations in the arrangement of bypass lines BL in the matrix of pixel regions rather than placing them in a simple linear order in vertical or horizontal directions. Accordingly, in some embodiments, a set of bypass lines BL connected to a common electrode block includes a bypass line BL from the set of bypass lines BL is displaced from at least one other bypass line BL of the same set. More specifically, the pixel region accommodating the lower contact hole CTL for a bypass line BL of the set of bypass lines BL is placed in a different row and a different column from the pixel region accommodating the lower contact hole CTL for at least one other bypass line BL of the same set.

As described in above, each common electrode block may be connected to a plurality of common signal lines SL as well as dummy lines DML. Further, a single common signal line or a single dummy line DML may be connected to the common electrode block by using multiple bypass lines BL. As such, the set of bypass lines BL connected to the common electrode block may be the bypass lines BL connected to a single common signal line SL, a plurality of common signal lines SL, a single dummy line DML, a plurality of dummy lines DML or a combination of the above.

Figure 7A:
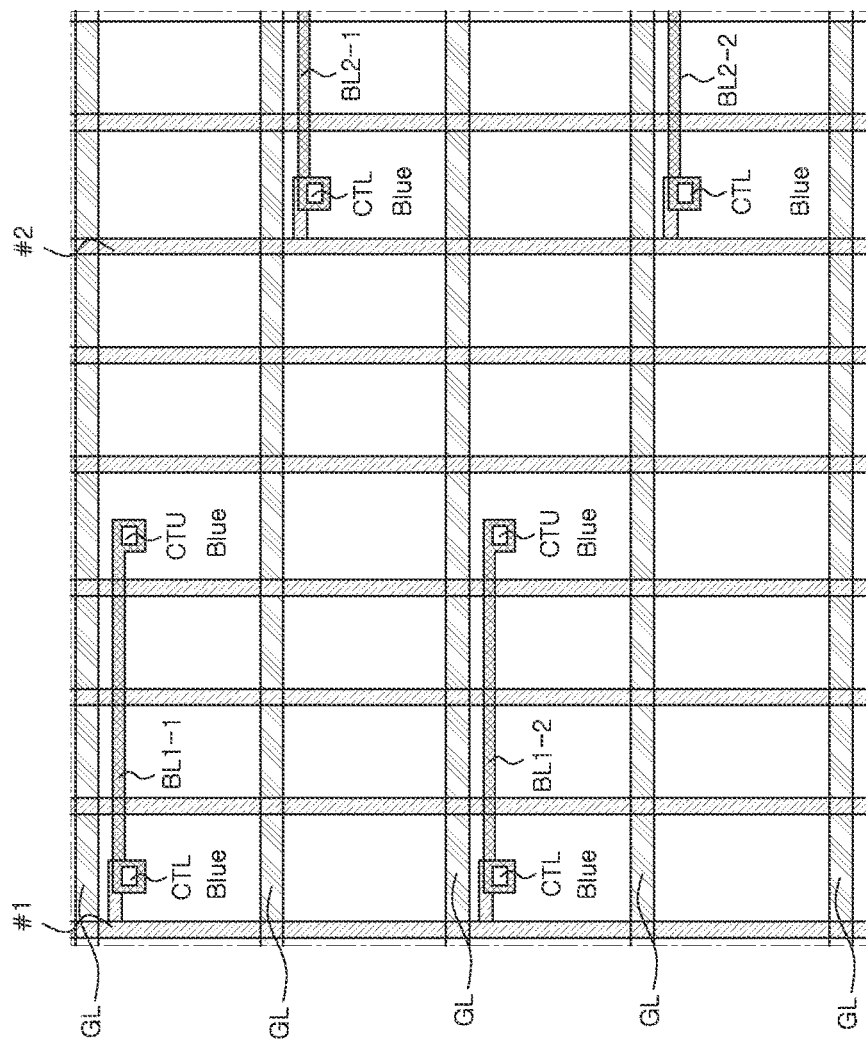
FIG. 7A illustrates an exemplary configuration of a set of bypass lines for connecting a plurality of common signal lines (or dummy lines) to a common electrode block.

FIG. 7A shows an exemplary configuration of a set of bypass lines for a common electrode block. In this example, the line #1 is connected to the common electrode block via two bypass lines (BL 1-1 and BL 1-2). The lower contact holes CTL for each of the bypass lines BL 1-1 and BL 1-2 are provided in the same column of pixel regions. Similarly, the line #2 is connected to the common electrode block via two bypass lines (BL 2-1 and BL 2-2), and the lower contact holes CTL for the each of the bypass line BL 2-1 and BL 2-2 are provided in the same column of pixel regions as each other. The line #1 and the line #2 may each be either a common signal line SL or a dummy line DML.

As shown, the pixel regions with the lower contact holes CTL for the bypass lines BL connected to the line #1 and the pixel regions with the lower contact holes CTL for the bypass lines BL connected to the line #2 are provided in different rows. Skewing the placement of contact holes for the bypass lines BL, at least to different rows from one another, can help in suppressing the visually noticeable pattern, such as the moiré effect.

As mentioned above, the lower contact holes CTL and the upper contact holes CTU may be provided in the blue pixel regions. Each of the upper contact holes CTU for the bypass lines BL may also be placed in a blue pixel region, which can be in the same row as the blue pixel that accommodates the lower contact hole CTL for the respective bypass line BL. It should be noted that the column of pixel regions including the pixels accommodating the contact holes needs not be formed entirely of blue pixels regions. Instead, the column may be formed of pixel regions with many different colors including the blue pixel regions where the contact holes are accommodated in.

Figure 7B:
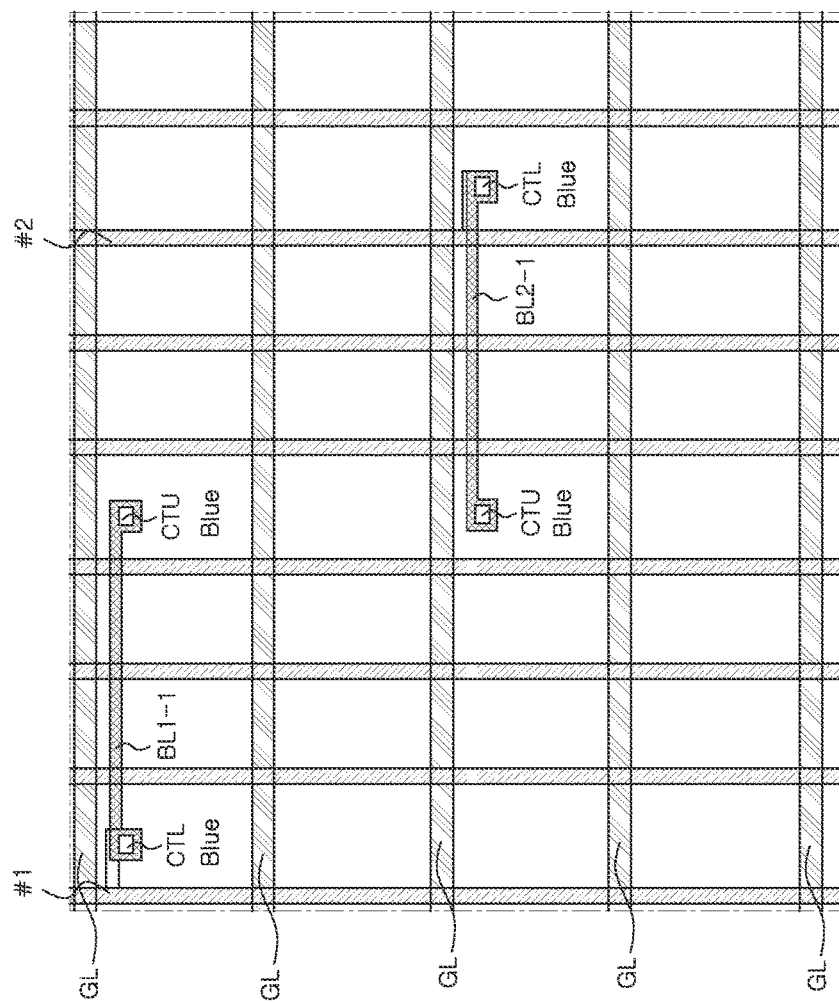
FIG. 7B illustrates an exemplary configuration of a set of bypass lines for connecting a plurality of common signal lines (or dummy lines) to a common electrode block.

FIG. 7B illustrates another exemplary configuration of a set of bypass lines BL connected to the common electrode block. Similar to the previous example, the line #1 and the line #2 are connected to the same common electrode via one or more bypass lines BL. In this particular example, however, some bypass lines BL extend to the left side while some other bypass lines BL extend to the right side of the underlying lines that they are connected to.

By way of an example, the bypass line BL 1-1 connected to the line #1 extends from the lower contact hole CTL to the upper contact hole CTU, which is provided further on the right side of the lower contact hole CTL for the bypass line BL 1-1. The bypass line BL 2-1 connected to the line #2 is extends from the lower contact hole CTL to the upper contact hole CTU, which is provided on the left side of the lower contact hole CTL for the bypass line BL 2-1. Although not depicted in FIG. 7B, other bypass lines connected to the line #1 and the line #2 may also be configured in the similar way as the bypass line BL 1-1 and the bypass line BL 2-1.

Figure 7C:
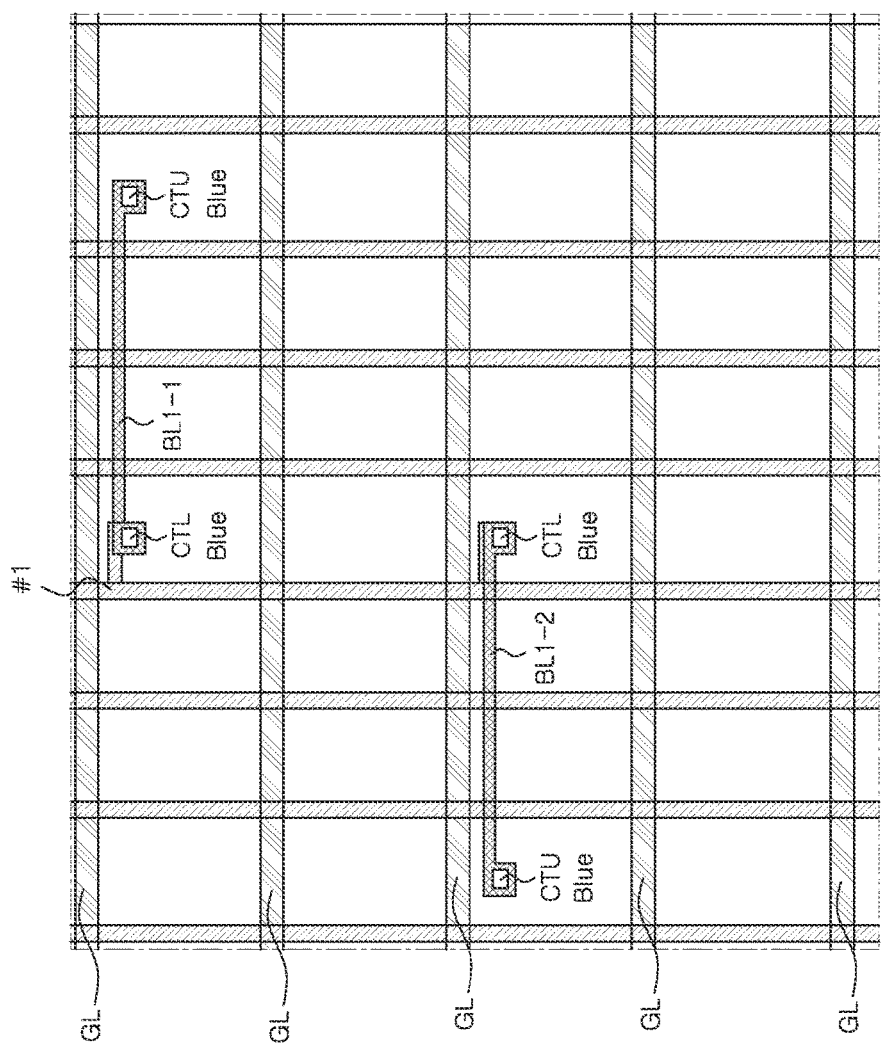
FIG. 7C illustrates an exemplary configuration of a set of bypass lines for a common electrode block, in which one of the bypass lines extends toward a first side of the common signal line (or dummy line) and another one of the bypass lines extends toward a second side of the common signal line (or dummy line).

Also, even among the bypass lines connected to the same common signal line SL, some bypass lines can be arranged to extend toward one side of the common signal line SL while some of the other bypass lines are arranged to extend toward in the other side. For instance, the bypass line BL 1-1 may extend toward the right side of the line #1, while the bypass line BL 1-2 extends toward the left side of the line #1 as depicted in FIG. 7C. That is, the lower contact hole CTL for the bypass line BL 1-1 and the lower contact hole CTL for the bypass line BL 1-2 are provided in the pixel region of the same column. On the other hand, the upper contact holes CTU for the bypass line BL 1-1 and the bypass line BL 1-2 are provided at the opposite sides of the line #1 from each other. Since the bypass lines are formed in the second metal layer (e.g., gate metal layer), they can be transversely extended across the line #1 (i.e., the first metal layer) and the data line DL (i.e., the third metal layer) placed thereon.

Although the lower contact holes CTL for the bypass lines BL were depicted as being provided in the pixel regions of the same column, in some other embodiments, the lower contact hole CTL for each of the bypass lines BL can be placed in pixel regions of different columns even when they are connected to the same common signal line SL (or the same dummy line DML).

Figure 7D:
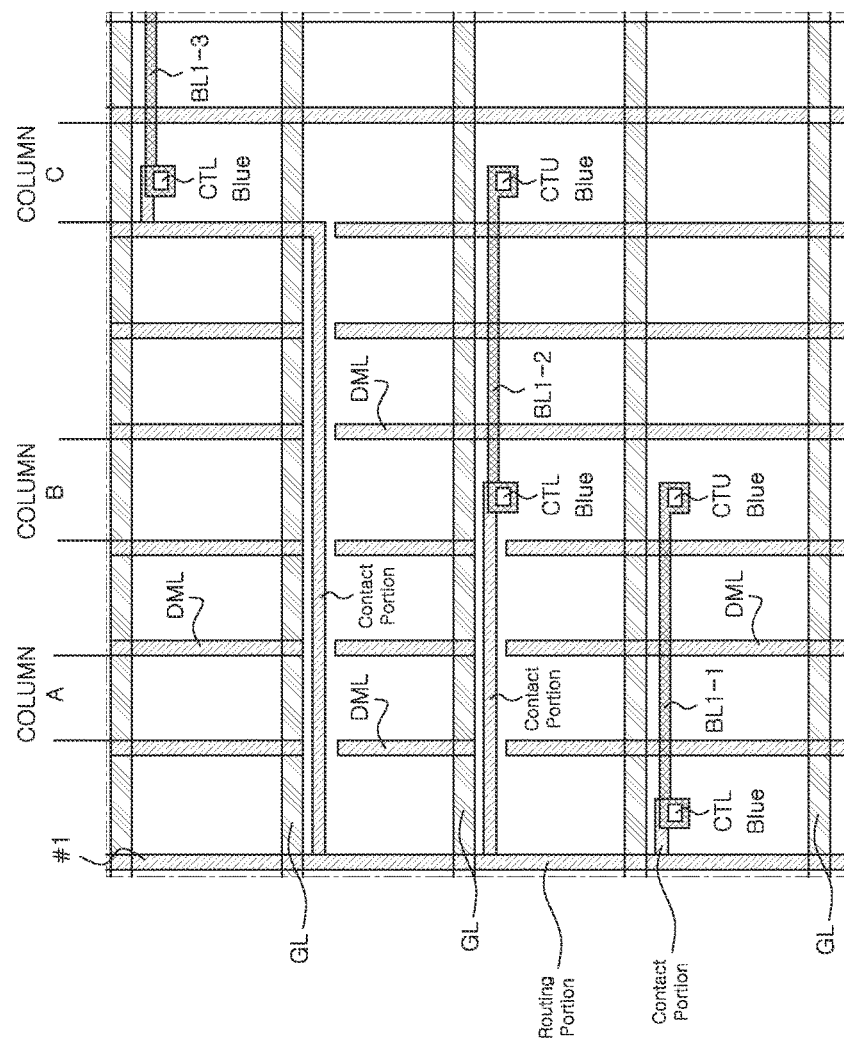
FIG. 7D illustrates an exemplary configuration of a set of bypass lines for a common electrode block, in which a common signal line is provided with a plurality of contact portions, each routed to a different pixel regions.

FIG. 7D illustrates yet another exemplary configuration of the bypass lines BL connected to the same common electrode block. Similar to the previous example, the line #1 is connected to a common electrode block via a plurality of bypass lines BL. Unlike the previous examples, however, the lower contact holes CTL for some of the bypass lines BL are provided in a pixel region away from the common signal line SL (or the dummy line DML).

Referring to FIG. 7D, the lower contact hole CTL for connecting the bypass line BL 1-1 to the line #1 is provided in the pixel region in a column A. The lower contact hole CTL for connecting the bypass line BL 1-2 to the line #1 is provided in the pixel region in a column B. Also, the lower contact hole CTL for connecting the bypass line BL 1-3 to the line #1 is provided in the pixel region in a column C. To this end, the line #1 is provided with the a plurality of contact portions projected out from the routing portion of the line #1, which are extended to the pixel regions of different columns where the contact is made with the corresponding bypass lines. To put it in another way, some contact portions of the line #1 may have a different length than others. As described before, the dummy line DML can be divided into multiple pieces to provide a passage for the contact portions to pass across and reach the pixel regions where the lower contact hole CTL are placed in. In this configuration, some contact portions would pass across a more or less number of dummy lines DML than other contact portions.

In FIG. 7D, the lower contact holes CTL for all of the bypass lines BL connected the line #1 were provided in the pixel regions of different columns. However, it should be appreciated that not all of the lower contact holes SL for the bypass lines BL needs to be provided in the pixel regions of different columns. In other words, some of the lower contact hole CTL for the bypass lines BL may still be provided in the same column with the lower contact holes CTL for other bypass lines BL.

Moreover, the contact portions of the line #1 can be arranged not just in X-direction but also in Y-direction as well. In such cases, the part of the contact portion being arranged in Y-direction can be extended under a data line DL, which is different from the one that is placed on the routing portion of the common signal line SL.

Referring to the example shown in FIG. 7D, the routing portion of the line #1 extends underneath the data line DL. The contact portions are projected out from the routing portion in the X-direction. A part of the contact portion being in contact with the bypass line BL 1-3 extends in the Y-direction underneath the data line DL_2, which then reaches the pixel region where the lower contact hole CTL is located. The contact portion being in contact with the bypass line BL 1-3 would be extended across a gate line GL. Of course, the number of gate lines GL which the contact portion crosses over varies by the length in which the part of contact portion extends in the Y-direction. Accordingly, some lower contact holes CTL can be provided in the pixel regions of the same column even though the contact portions are provided in different lengths.

In FIG. 7D, the contact portions of the line #1 were projected out to the right side of the routing portion. However, it should be appreciated that some common signal lines SL or dummy lines DML may include contact portions that are projected out in the opposite direction another contact portion of the same line.

In FIGS. 7A-7D, the configuration of bypass lines BL have been described in reference to just single common electrode block. However, it should be noted that the common electrode blocks in a display panel 100 need not be configured in the same way as each other. In other words, configuration of the common signal lines SL and the bypass lines BL in one common electrode block may differ from the configuration of those in another common electrode block. In this way, more complex bypass line BL pattern can be provided in the display panel 100 as a whole.

The embodiments have been described with the common signal lines SL extended along under the corresponding data lines DL. However, features described herein can also be used even when the common signal lines SL are arranged to extend along under the gate lines GL. Further, embodiments have been described in the context of LCD display panel the having the pixel-top configuration. However, the configuration of the common signal lines SL under the TFTs and the connections to the corresponding common electrode blocks via the bypass lines BL as well as the asymmetric masking layer BM configuration for compensation of aperture ratio discrepancy can be equally applied to the VCOM-top configuration.

In the present disclosure, all of the embodiments have been described as having the common signal lines SL and the data lines positioned to overlap one another. The width of the common signal lines SL can be equal to the width of the data lines DL. However, it should be noted that the width of the common signal lines SL and the width of the data lines DL can differ from each other. With the common electrode being provided in a plurality of common electrode blocks, the field at the region between the two adjacent common electrode blocks can be different from other regions on the common electrode block. As such, controlling of the liquid crystal molecules over such regions may be difficult, and the light from the backlight can leak into the pixels near such regions.

Accordingly, a data line DL and a common signal line SL can be placed in the region between the two adjacent common electrode blocks. This way, the data line DL and the common signal line SL can be used to block the light from the backlight. The width of the data lines DL and the width of the common signal lines SL can be adjusted according to the distance between the two adjacent blocks. In this regard, increasing the width of the common signal lines SL can help reduce the resistance and lower the RC delay on the common signal lines SL. In the embodiments with the common signal lines SL disposed under the data lines DL, the width of the common signal lines SL can be greater than the width of the data lines DL. Since the common signal lines SL are placed further away from the common electrode blocks and the pixel electrodes than the data lines DL, managing the coupling capacitance may be easier for the common signal lines SL than the data lines DL.

In the embodiments disclosed in the present disclosure, the common signal lines SL are arranged parallel to the data lines DL and routed directly across the active area towards the non-display area. By routing the common signal lines SL directly across the active area, the size of the inactive area at the side of the panel can be reduced. Further, the thickness of the passivation layer between the pixel electrode PXL and the common electrode blocks can be kept minimal to increase the capacitance of the pixel. Since, the common signal lines SL can be spaced farther away from the common electrode blocks, they can be provided with a desired thickness to decrease RC delays during touch-sensing period. In addition, there is no fringe field generated between the common electrode blocks and the common signal lines SL as the common electrode blocks positioned above the common signal lines SL. This effectively solves the light leakage problem caused by having the common signal lines SL in the same layer as the pixel electrode PXL.

In the embodiments of the present disclosure, the transparent electrode and the common signal lines SL are described in reference to a touch recognition enabled LCD device. However, the use of the transparent electrode (e.g., common electrode block) and the common signal line SL is not limited to displaying images from the panel and identifying the location of touch inputs. The functionalities of the transparent electrode and the common signal lines SL during other periods are not limited to activating the pixels (e.g., LCD pixel) as described above. In addition to touch-sensing functionality, the common electrode blocks and the common signal lines SL may be used in measuring amount of touch pressure on the screen, generating vibration on the screen or actuating electro-active materials in the panel.

For example, some embodiments of the display panel 100 may include a layer of deformable material. The common electrode blocks may be interfaced or positioned near the deformable material, and loaded with voltage signals to measure electrical changes caused by the deformation of the deformable material. In such cases, the common electrode blocks can measure the amount of pressure on the display panel 100 in addition to the location of the touch inputs. In some embodiments, the deformable material may be electro-active materials, which the amplitude and/or the frequency of the material can be controlled by electrical signals and/or electrical field. The examples of such deformable materials include piezo ceramic, electro-active-polymer and the like. In such embodiments, the common electrode blocks can be used to bend the deformable material into desired directions and/or to vibrate at desired frequencies, thereby providing tactile and/or texture feedback on the display panel 100.

Furthermore, the features described in the present disclosure can also be adopted in display technologies other than LCD. For instance, features described in the present disclosure can also be in the OLED display. It will be apparent to those skilled in the art that various modifications and variations can be made in the present invention without departing from the scope of the inventions. Thus, it is intended that the present invention covers the modifications and variations of this invention provided they come within the scope of the appended claims and their equivalents.

What is claimed is:

1. A display panel, comprising:
    a plurality of common signal lines on a substrate;
    a lower planarization layer covering the plurality of common signal lines;
    an array of thin-film transistors (TFTs) on the lower planarization layer, each thin-film transistor (TFT) being connected to a gate line and a data line on the lower planarization layer;
    an upper planarization layer covering the array of TFTs; and
    a plurality of pixel electrodes and a plurality of common electrode blocks on the upper planarization layer,
    wherein each of the common signal lines being connected to one of the plurality of common electrode blocks via a set of bypass lines, in which each bypass line in the set of bypass lines is connected to the common signal line via a lower contact hole through the lower planarization layer and connected to the common electrode block via an upper contact hole through the upper planarization layer,
    wherein the set of bypass lines are provided in between the lower planarization layer and the upper planarization layer, and
    wherein each of the common signal lines includes a routing portion extended parallel to the data lines and a plurality of contact portions transversely projected out from the routing portion, said plurality of contact portions being routed to the lower contact holes such that each of the contact portions is in contact with the corresponding ones of the bypass lines among the set of bypass lines.

2. The display panel of claim 1, wherein the set of bypass lines includes a bypass line contacting the common signal line via a lower contact hole through the lower planarization layer at a first pixel region and another bypass line contacting the same common signal line via a lower contact hole through the lower planarization layer at a second pixel region in which the first pixel region and the second pixel region are positioned in a different row and a column from each other.

3. The display panel of claim 1, wherein the set of bypass lines includes a bypass line connected to said one of the plurality of common electrode blocks via an upper contact hole through the upper planarization layer at a first pixel region and another bypass line contacting the same common electrode block via an upper contact hole through the upper planarization layer at a second pixel in which the first pixel region and the second pixel region are positioned in a different row and a column from each other.

4. The display panel of claim 1, wherein the lower contact holes and the upper contact holes are placed in blue pixel regions.

5. The display panel of claim 1, wherein the lower contact hole and the upper contact hole for at least one of the bypass lines in the set of bypass lines are placed in blue pixel regions that are placed adjacent to each other in the same row of pixel regions.

6. The display panel of claim 1, wherein the plurality of contact portions of at least one of the common signal lines includes a contact portion extending toward a first side of the routing portion of the respective common signal line and another contact portion extending toward a second side of the routing portion of the same common signal line.

7. The display panel of claim 1, wherein the plurality of contact portions of at least one of the common signal lines includes a contact portion arranged to extend across one or more of the plurality of gate lines.

8. The display panel of claim 1, further comprising a plurality of dummy lines, wherein the plurality of contact portions of at least one of the common signal lines includes a contact portion arranged to extend across one or more of dummy lines.

9. The display panel of claim 8, wherein the plurality of contact portions of at least one of the common signal lines includes at least two contact portions, each being arranged to extend across a different number of dummy lines.

10. A touch recognition enabled liquid crystal display panel, comprising:
    a plurality of pixels operated by a pixel electrode and a common electrode, in which the common electrode is divided into a plurality of common electrode blocks, each common electrode block being shared by a group of pixels;
    a plurality of common signal lines, each common signal line being configured to transmit touch control recognition signals between a touch drive integrated circuit and one or more of the common electrode blocks;
    a lower planarization layer provided over the plurality of common signal lines;
    a plurality of thin-film-transistors on the lower planarization layer; and
    an upper planarization layer provided over the plurality of thin-film-transistors and below the pixel electrodes and the plurality of common electrode blocks, wherein each of the common electrode blocks is connected to at least one of the common signal lines via a set of bypass lines,
    wherein the set of bypass lines for one of the plurality of common electrode blocks is arranged differently from the set of bypass lines for another one of the common electrode blocks, and
    wherein each of the common signal lines includes a routing portion and a plurality of contact portions transversely projected out from the routing portion to one of the set of bypass lines, and wherein an arrangement of the plurality of contact portions for one of the plurality of common electrode blocks is different from an arrangement of the plurality of contact portions for another one of the plurality of common electrode blocks.

* * * * *